United States Patent
Kim et al.

(10) Patent No.: US 11,764,295 B2
(45) Date of Patent: Sep. 19, 2023

(54) GATE TRENCH POWER SEMICONDUCTOR DEVICES HAVING IMPROVED DEEP SHIELD CONNECTION PATTERNS

(71) Applicant: Wolfspeed, Inc., Durham, NC (US)

(72) Inventors: Woongsun Kim, Cary, NC (US); Sei-Hyung Ryu, Cary, NC (US); Daniel Jenner Lichtenwalner, Raleigh, NC (US); Naeem Islam, Morrisville, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/092,923

(22) Filed: Nov. 9, 2020

(65) Prior Publication Data

US 2022/0149196 A1 May 12, 2022

(51) Int. Cl.
*H01L 29/78* (2006.01)
*H01L 29/66* (2006.01)
*H01L 29/808* (2006.01)

(52) U.S. Cl.
CPC .... *H01L 29/7813* (2013.01); *H01L 29/66734* (2013.01); *H01L 29/66924* (2013.01); *H01L 29/8083* (2013.01)

(58) Field of Classification Search
CPC ........... H01L 29/7813; H01L 29/66734; H01L 29/66924; H01L 29/8083; H01L 29/7833–7836
See application file for complete search history.

(56) References Cited

U.S. PATENT DOCUMENTS

| | | | |
|---|---|---|---|
| 9,887,287 B1* | 2/2018 | Lichtenwalner | ...... H01L 27/088 |
| 2019/0172944 A1 | 6/2019 | Okumura | |
| 2019/0348524 A1 | 11/2019 | Ebiike et al. | |

OTHER PUBLICATIONS

Notification of Transmittal of the International Search Report and the Written Opinion of the International Searching Authority, or the Declaration, in corresponding PCT Application No. PCT/US2021/058238 (dated Jan. 31, 2022).

* cited by examiner

*Primary Examiner* — Laura M Menz
*Assistant Examiner* — Candice Chan
(74) *Attorney, Agent, or Firm* — Myers Bigel, P.A.

(57) ABSTRACT

A power semiconductor device includes a semiconductor layer structure comprising a drift region of a first conductivity type and a well region of a second conductivity type, a plurality of gate trenches including respective gate insulating layers and gate electrodes therein extending into the drift region, respective shielding patterns of the second conductivity type in respective portions of the drift region adjacent the gate trenches, and respective conduction enhancing regions of the first conductivity type in the respective portions of the drift region. The drift region comprises a first concentration of dopants of the first conductivity type, and the respective conduction enhancing regions comprise a second concentration of the dopants of the first conductivity type that is higher than the first concentration. Related devices and fabrication methods are also discussed.

21 Claims, 16 Drawing Sheets

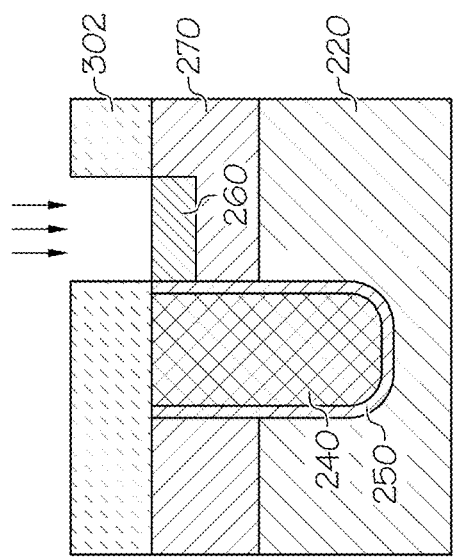
FIG. 3A
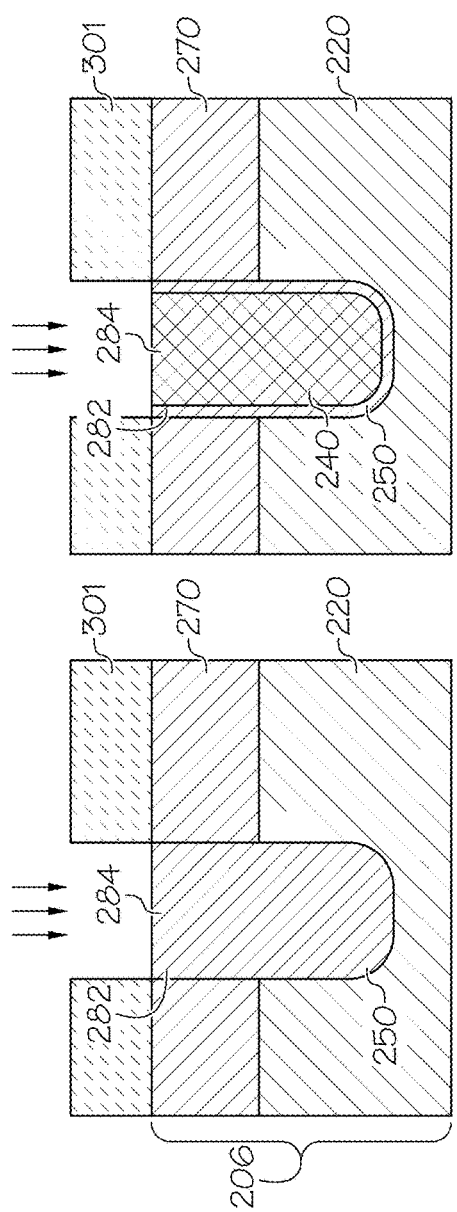
FIG. 3B
FIG. 3C
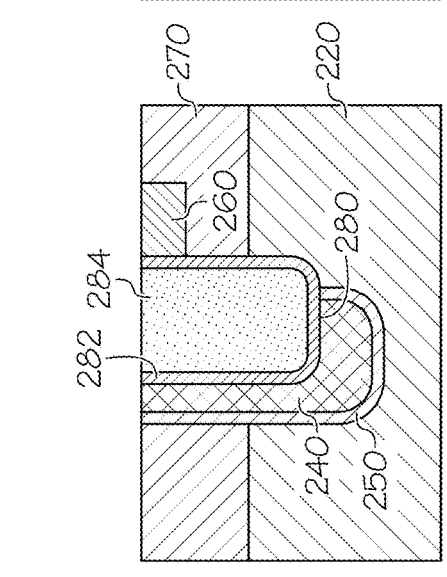
FIG. 3D
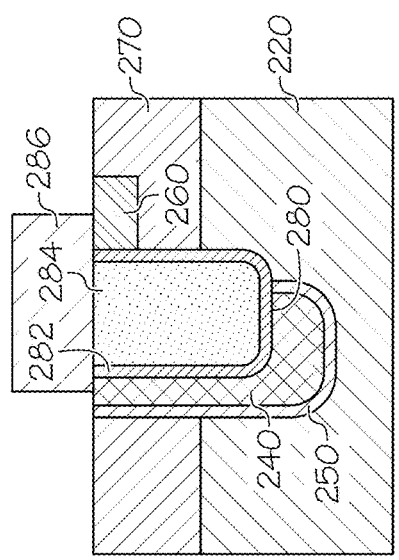
FIG. 3E
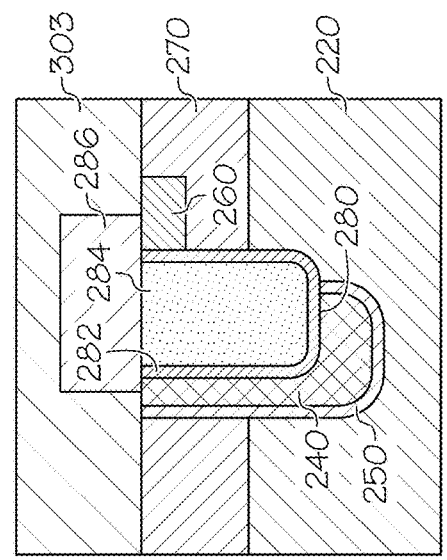
FIG. 3F

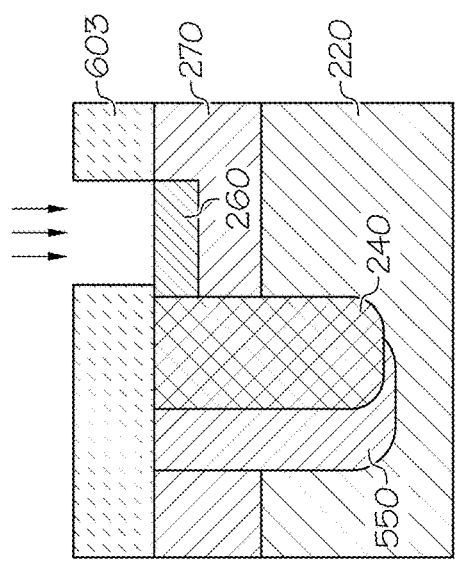
FIG. 6A
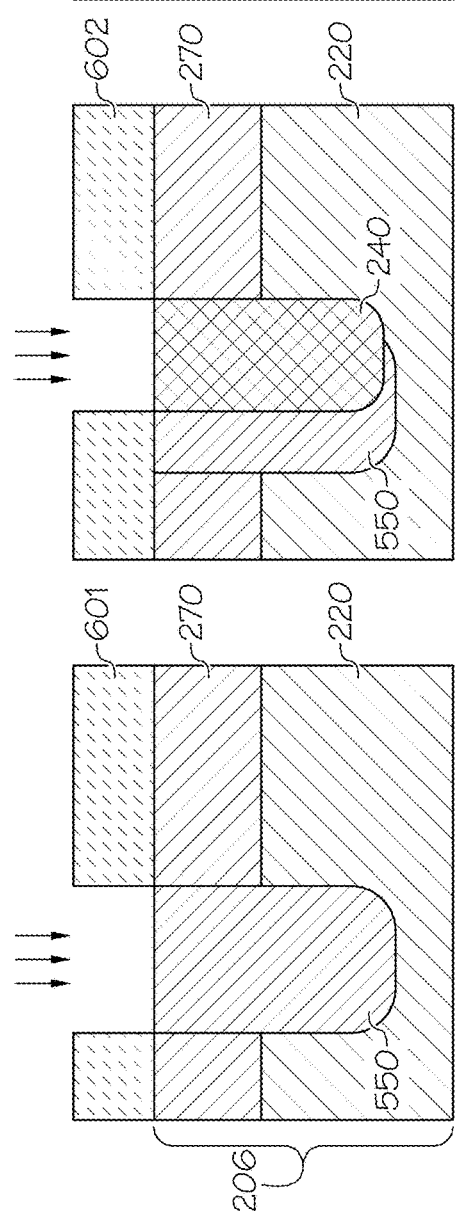
FIG. 6B
FIG. 6C
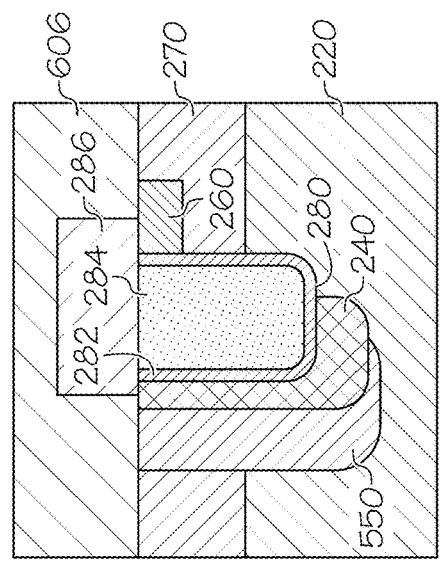
FIG. 6D
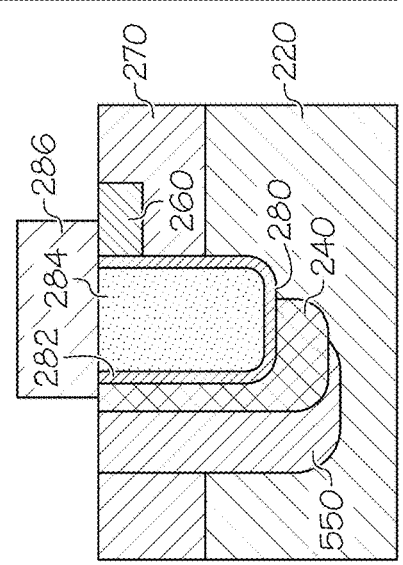
FIG. 6E
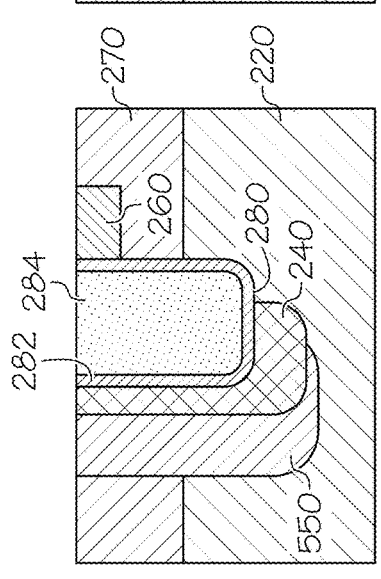
FIG. 6F

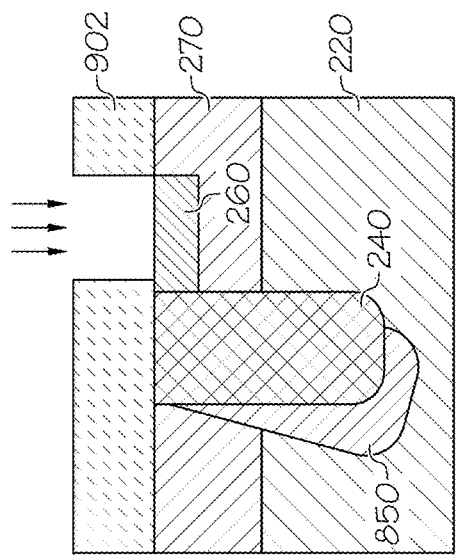
FIG. 9A
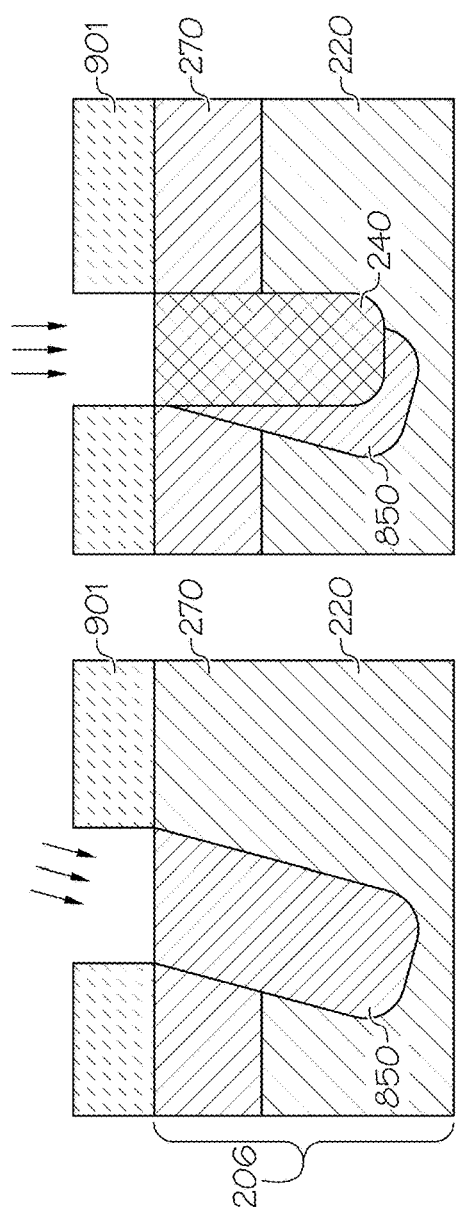
FIG. 9B
FIG. 9C
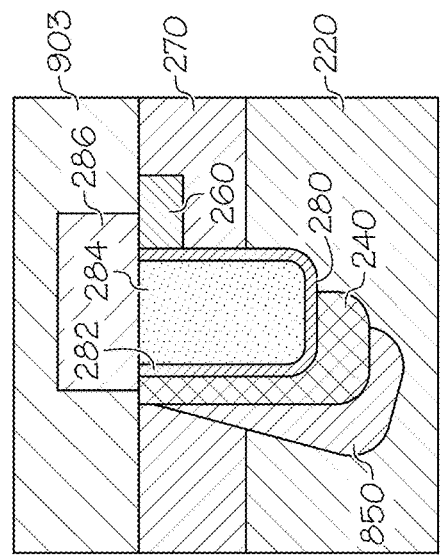
FIG. 9D
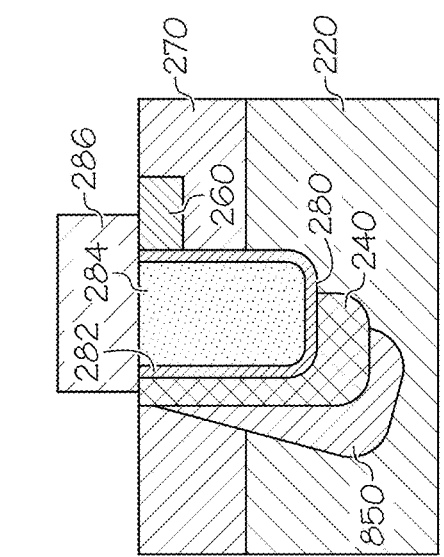
FIG. 9E
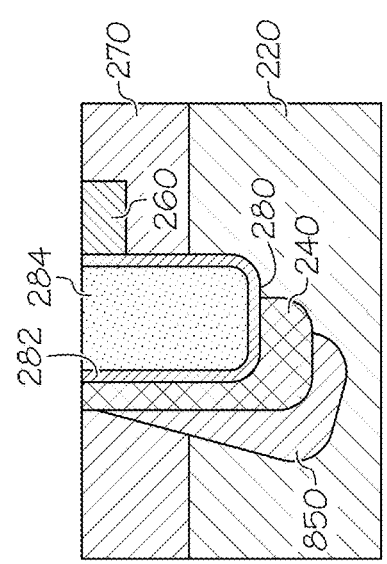
FIG. 9F

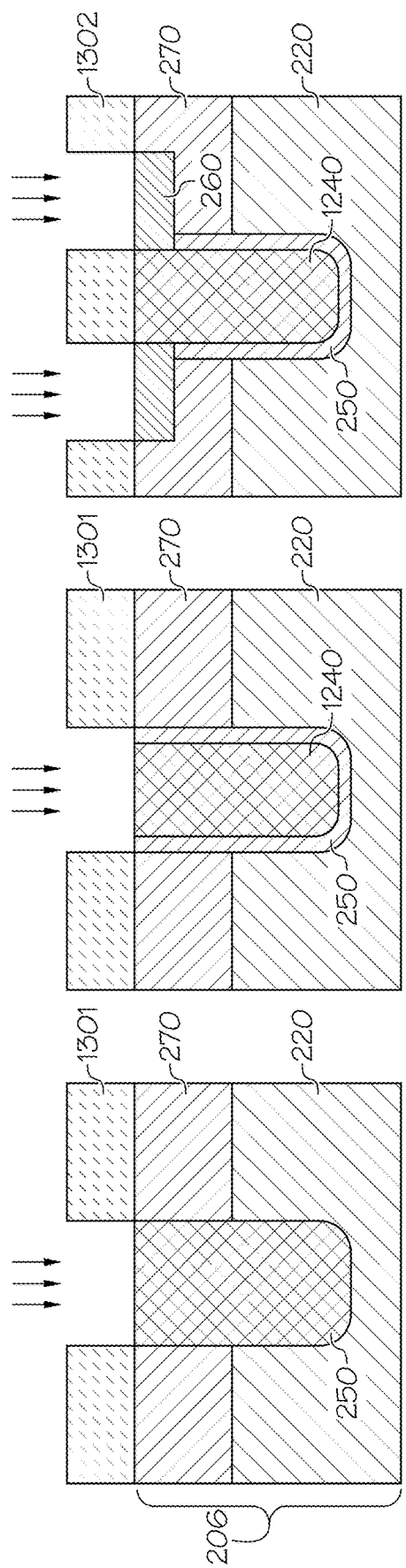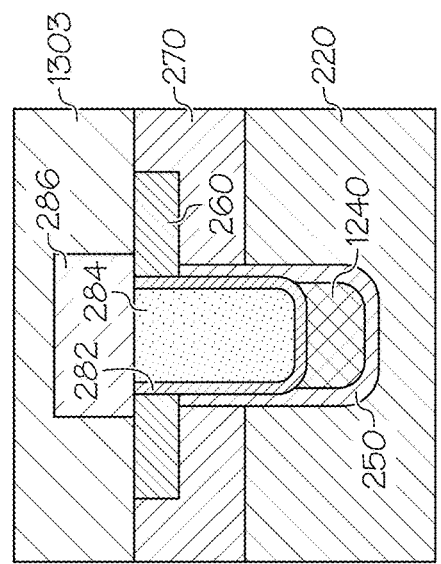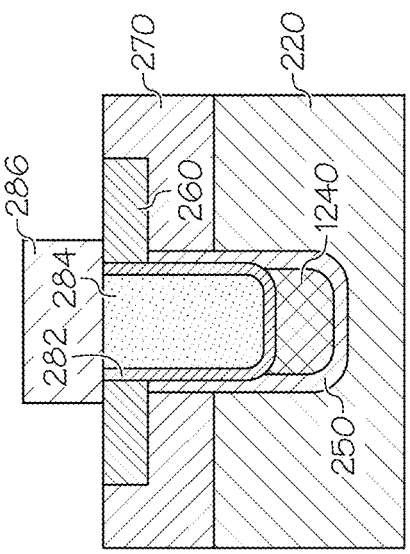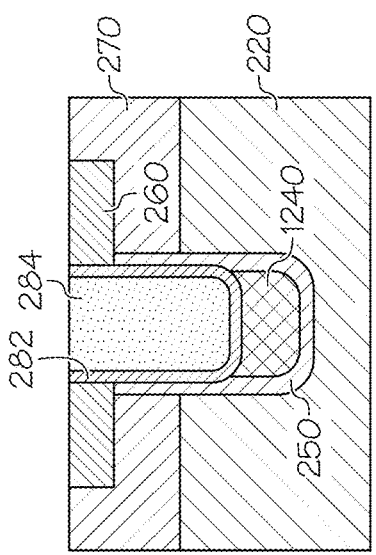

GATE TRENCH POWER SEMICONDUCTOR DEVICES HAVING IMPROVED DEEP SHIELD CONNECTION PATTERNS

FIELD

The present invention relates to semiconductor devices and, more particularly, to power semiconductor devices.

BACKGROUND

Power semiconductor devices are used to carry large currents and support high voltages. A wide variety of power semiconductor devices are known in the art including, for example, power Metal Insulator Semiconductor Field Effect Transistors ("MISFETs", including Metal Oxide Semiconductor FETs ("MOSFETs")), bipolar junction transistors ("BJTs"), Insulated Gate Bipolar Transistors ("IGBT"), Junction Barrier Schottky diodes, Gate Turn-Off Transistors ("GTO"), MOS-controlled thyristors, and various other devices. These power semiconductor devices are generally fabricated from wide bandgap semiconductor materials, for example, silicon carbide ("SiC") or gallium nitride ("GaN") based semiconductor materials. Herein, a wide bandgap semiconductor material refers to a semiconductor material having a bandgap greater than about 1.40 eV, for example, greater than about 2 eV.

A conventional power semiconductor device typically has a semiconductor substrate having a first conductivity type (e.g., an n-type substrate) on which an epitaxial layer structure having the first conductivity type (e.g., n-type) is formed. A portion of this epitaxial layer structure (which may comprise one or more separate layers) functions as a drift layer or drift region of the power semiconductor device. The device typically includes an "active region," which includes one or more "unit cell" structures that have a junction, for example, a p-n junction. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices.

Power semiconductor devices may have a unit cell configuration in which the active region of each power semiconductor device includes a large number of individual "unit cell" structures that are electrically connected in parallel to function as a single power semiconductor device. In high power applications, such a power semiconductor device may include thousands or tens of thousands of unit cells implemented in a single chip or "die." A die or chip may include a small block of semiconducting material or other substrate in which electronic circuit elements are fabricated.

Power semiconductor devices can have a lateral structure or a vertical structure. In a device having a lateral structure, the terminals of the device (e.g., the drain, gate and source terminals for a power MOSFET device) are on the same major surface (e.g., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes one or more semiconductor layers, for example, semiconductor substrates and/or semiconductor epitaxial layers.

Vertical power semiconductor devices that include a MOSFET transistor can have a standard gate electrode design in which the gate electrode of the transistor is formed on top of the semiconductor layer structure or, alternatively, may have the gate electrode buried in a trench within the semiconductor layer structure. MOSFETs having buried gate electrodes are typically referred to as gate trench MOSFETs. With the standard gate electrode design, the channel region of each unit cell transistor is horizontally disposed underneath the gate electrode. In contrast, in the gate trench MOSFET design, the channel is vertically disposed. Gate trench MOSFETs may provide enhanced performance, but typically require a more complex manufacturing process.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. As the applied voltage approaches or passes the voltage level that the device is designed to block, non-trivial levels of current (referred to as leakage current) may begin to flow through the power semiconductor device. The blocking capability of the device may be a function of, among other things, the doping and thickness of the drift region. Leakage currents may also arise for other reasons, such as failure of the edge termination and/or the primary junction of the device. If the voltage applied to the device is increased past the breakdown voltage to a critical level, the increasing electric field may result in an uncontrollable and undesirable runaway generation of charge carriers within the semiconductor device, leading to a condition known as avalanche breakdown.

Also, the relatively thin gate insulating layer (e.g., a gate oxide layer) that separates the gate electrode from the semiconductor layer structure can degrade when the gate insulating layer is subjected to high electric field levels, during either on-state (conducting) or off-state (blocking) operation. This degradation of the gate insulating layer may ultimately lead to breakdown of the gate insulating layer, at which point the gate electrode may short circuit to the semiconductor layer structure, which can destroy the device.

SUMMARY

According to some embodiments, a power semiconductor device includes a semiconductor layer structure comprising a drift region of a first conductivity type and a well region of a second conductivity type; a plurality of gate trenches extending into the drift region; respective shielding patterns of the second conductivity type in respective portions of the drift region adjacent the gate trenches; and respective conduction enhancing regions of the first conductivity type in respective portions of the drift region. The respective conduction enhancing regions extend into the well region adjacent the respective shielding patterns. The drift region comprises a first concentration of dopants of the first conductivity type, and the respective conduction enhancing regions comprise a second concentration of the dopants of the first conductivity type that is higher than the first concentration.

In some embodiments, the gate trenches may be spaced apart from one another along a first direction, and the respective conduction enhancing regions may be spaced apart from respective corners of the gate trenches along the first direction.

In some embodiments, the respective portions of the drift region between the gate trenches may include a concentration gradient of the dopants of the first conductivity type that varies between the first concentration and the second concentration along the first direction.

In some embodiments, the drift region may include the first concentration of the dopants proximate the respective corners of the gate trenches, and the second concentration may be higher than the first concentration by a factor of about 2 or more.

In some embodiments, responsive to a voltage applied to the power semiconductor device, the respective portions of the drift region between the gate trenches may include an electric field distribution having a peak that is distal from the respective corners of the gate trenches in the first direction.

In some embodiments, the peak of the electric field distribution may be greater than a strength of the electric field distribution proximate the respective corners of the gate trenches by a factor of about 10 or more.

In some embodiments, the respective conduction enhancing regions may be between the gate trenches and may extend into the drift region beyond a lower boundary of the respective shielding patterns.

In some embodiments, the respective conduction enhancing regions may be offset from the respective shielding patterns towards the gate trenches.

In some embodiments, the respective conduction enhancing regions may extend along opposing sides and the lower boundary of the respective shielding patterns.

In some embodiments, the respective conduction enhancing regions may extend along an axis that is non-orthogonal to a surface of the drift region.

In some embodiments, the semiconductor layer structure may further include a current spreading layer comprising a third concentration of the dopants of the first conductivity type that is higher than the first and/or second concentrations, and the respective portions of the drift region comprising the respective conduction enhancing regions may be between the well regions and the current spreading layer.

In some embodiments, the semiconductor layer structure may include a wide bandgap semiconductor, the drift region may be an epitaxial layer of the first conductivity type, and the respective conduction enhancing regions may be implanted regions of the first conductivity type.

According to some embodiments, a power semiconductor device includes a semiconductor layer structure comprising a drift region of a first conductivity type and a well region of a second conductivity type; and a plurality of gate trenches extending into the drift region. The gate trenches are spaced apart from one another in a first direction, and respective portions of the drift region adjacent the gate trenches comprise a concentration of dopants of the first conductivity type that varies along the first direction.

In some embodiments, the drift region may include respective conduction enhancing regions of the first conductivity type that are spaced apart from respective corners of the gate trenches along the first direction. The concentration of the dopants of the first conductivity type may include a first concentration proximate the respective corners of the gate trenches and a second concentration in the respective conduction enhancing regions, where the second concentration is higher than the first concentration.

In some embodiments, the concentration of the dopants of the first conductivity type further includes a concentration gradient of the dopants of the first conductivity type between the first concentration and the second concentration along the first direction.

In some embodiments, the second concentration may be higher than the first concentration by a factor of about 2 or more.

In some embodiments, respective shielding patterns of the second conductivity type may be provided in the respective portions of the drift region between the gate trenches and/or under the gate trenches, and the respective conduction enhancing regions may be between the gate trenches and may extend into the drift region beyond a lower boundary of the respective shielding patterns. The respective conduction enhancing regions may be offset from the respective shielding patterns towards the gate trenches, and/or the respective conduction enhancing regions may extend along at least one of a side or a lower boundary of the respective shielding patterns.

In some embodiments, responsive to a voltage applied to the power semiconductor device, the respective portions of the drift region between the gate trenches may include an electric field distribution having a peak that is distal from the respective corners of the gate trenches in the first direction.

In some embodiments, the peak of the electric field distribution may be greater than a strength of the electric field distribution proximate the respective corners of the gate trenches by a factor of about 2 or more.

According to some embodiments, a power semiconductor device includes a semiconductor layer structure comprising a drift region of a first conductivity type and a well region of a second conductivity type; and a plurality of gate trenches extending into the drift region. Responsive to a voltage applied to the power semiconductor device, respective portions of the drift region between the gate trenches comprise an electric field distribution having a peak that is distal from respective corners of the gate trenches.

In some embodiments, the gate trenches may be spaced apart from one another in a first direction, and the electric field distribution in the respective portions of the drift region between the gate trenches may be asymmetric along the first direction.

In some embodiments, the peak of the electric field distribution may be greater than a strength of the electric field distribution proximate the respective corners of the gate trenches by a factor of about 10 or more.

In some embodiments, the respective portions of the drift region between the gate trenches comprise a concentration of dopants of the first conductivity type that varies along the first direction.

In some embodiments, respective conduction enhancing regions of the first conductivity type may be spaced apart from the respective corners of the gate trenches along the first direction, the concentration of the dopants of the first conductivity type may include a first concentration proximate the respective corners of the gate trenches and a second concentration in the respective conduction enhancing regions, and the second concentration may be higher than the first concentration.

In some embodiments, the concentration of the dopants of the first conductivity type may further include a concentration gradient of the dopants of the first conductivity type between the first concentration and the second concentration along the first direction.

In some embodiments, the second concentration may be higher than the first concentration by a factor of about 10 or more.

In some embodiments, the respective conduction enhancing regions may include the peak of the electric field distribution.

According to some embodiments, a method of fabricating a power semiconductor device includes forming a semiconductor layer structure comprising a drift region of a first conductivity type and a well region of a second conductivity type; forming respective conduction enhancing regions of the first conductivity type in respective portions of the drift region; forming respective shielding patterns of the second conductivity type in the respective portions of the drift region; and forming a plurality of gate trenches extending into the drift region in the respective portions of the drift region. The respective conduction enhancing regions extend into the well region adjacent the respective shield patterns, the drift region comprises a first concentration of dopants of the first conductivity type, and the respective conduction enhancing regions comprise a second concentration of the dopants of the first conductivity type that is higher than the first concentration.

In some embodiments, the gate trenches may be spaced apart from one another along a first direction, and the respective conduction enhancing regions may be spaced apart from respective corners of the gate trenches along the first direction.

In some embodiments, the respective portions of the drift region between the gate trenches may include a concentration gradient of the dopants of the first conductivity type that varies between the first concentration and the second concentration along the first direction.

In some embodiments, the semiconductor layer structure may include a wide bandgap semiconductor, the drift region may include an epitaxial layer of the first conductivity type, and the respective conduction enhancing regions may include implanted regions of the first conductivity type.

In some embodiments, the drift region may include the first concentration of the dopants proximate the respective corners of the gate trenches, and the second concentration may be higher than the first concentration by a factor of about 10 or more.

In some embodiments, the respective conduction enhancing regions may be between the gate trenches and may extend into the drift region beyond a lower boundary of the respective shielding patterns.

In some embodiments, the respective conduction enhancing regions may be offset from the respective shielding patterns towards the gate trenches, and/or the respective conduction enhancing regions may extend along at least one of a side or a lower boundary of the respective shielding patterns.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 3A, 3B, 3C, 3D, 3E, and 3F are schematic cross-sectional views illustrating example operations for fabricating the gate trench power semiconductor device of FIG. 2.

FIGS. 6A, 6B, 6C, 6D, 6E, and 6F are schematic cross-sectional views illustrating example operations for fabricating the gate trench power semiconductor device of FIG. 5.

FIGS. 9A, 9B, 9C, 9D, 9E, and 9F are schematic cross-sectional views illustrating example operations for fabricating the gate trench power semiconductor device of FIG. 8.

FIGS. 13A, 13B, 13C, 13D, 13E, and 13F are schematic cross-sectional views illustrating example operations for fabricating gate trench power semiconductor devices including bottom shielding regions.

DETAILED DESCRIPTION OF EMBODIMENTS

Some embodiments of the present invention are directed to improvements in power semiconductor devices (e.g., MOSFETs and other gate controlled power devices). Many power semiconductor devices include so-called deep or 'buried' shielding semiconductor regions, also referred to as shielding patterns, of a different conductivity type than the layer(s) of the semiconductor material underneath the well regions and/or gate electrodes of the device. For example, in devices having gate electrodes and gate insulating layers formed within trenches in the semiconductor layer structure, high electric fields may degrade the gate insulating layer over time, and may eventually result in failure of the device. The deep shielding patterns may be provided underneath the gate trenches in order to reduce the electric field levels in the gate insulating layer, particularly at corners of the gate trenches where the electric field levels may be more concentrated. The deep shielding patterns include highly doped semiconductor layers having the same conductivity type as the channel region.

Figure 1A:
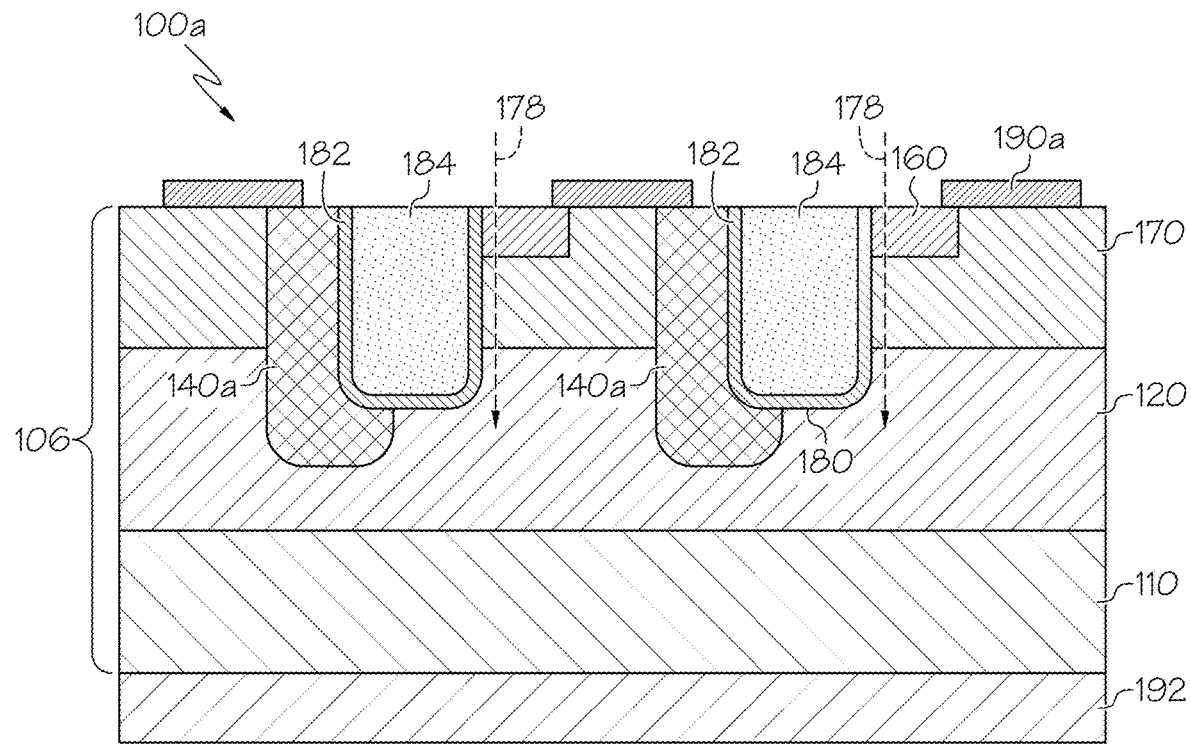
FIG. 1A is a schematic cross-sectional view illustrating an example of a gate trench power semiconductor device including shielding regions blocking one side of the gate trenches.
Figure 1B:
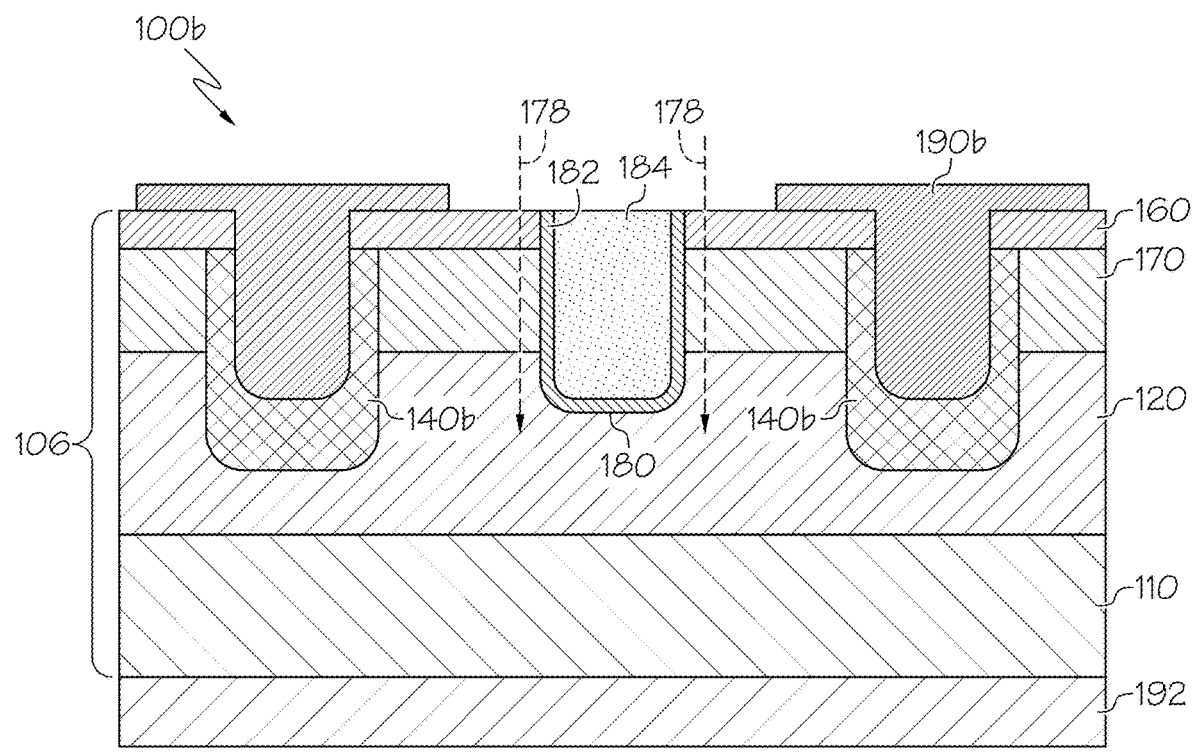
FIG. 1B is a schematic cross-sectional view illustrating an example of a gate trench power semiconductor device including alternating shielding regions and gate trench regions.

Various approaches may be used to form trenched vertical power semiconductor devices. FIGS. 1A and 1B schematically illustrate two examples of such different approaches. Although described and illustrated herein with reference to regions of specific conductivity types (i.e., n-type and p-type) by way of example, it will be understood that the conductivity types of the regions in any of the illustrated examples may be reversed (i.e., p-type and n-type) in accordance with embodiments of the present invention.

FIGS. 1A and 1B are schematic cross-sectional views illustrating examples of trenched vertical power devices (illustrated as power MOSFET 100a, 100b) including deep buried P-type shielding regions 140a, 140b. As shown in FIGS. 1A and 1B, the power MOSFET 100a, 100b each include a heavily-doped (N$^+$) n-type substrate 110, e.g., a silicon carbide substrate. A lightly-doped (N$^-$) n-type drift layer or region 120 is provided on the substrate 110, for example by epitaxial growth. In some embodiments, a portion of the n-type drift region 120 may include an-type current spreading layer ("CSL") having a higher dopant concentration than the upper portion of the drift region 120 (illustrated as layer 1530 in the example of FIG. 15). A moderately-doped p-type layer is formed (for example, by epitaxial growth or implantation) on the drift region 120 and acts as the p-type well regions (or "P-wells") 170 for the device 100a, 100b. The substrate 110, drift region 120 (including current spreading layer) and the moderately doped p-type layer defining the P-wells 170, along with the various regions/patterns formed therein, are included in a semiconductor layer structure 106 of the MOSFETs 100a, 100b.

Still referring to FIGS. 1A and 1B, trenches 180 are formed in the semiconductor layer structure 106 with 'striped' gate trench layouts, in which the trenches 180 continuously extend in parallel to one another in a longitudinal direction, and are spaced apart in a direction crossing (e.g., perpendicular to) the longitudinal direction. The trenches 180 (in which the gates electrodes 184 are formed) extend through the moderately-doped p-type layer 170 to define the respective P-wells. Heavily-doped (P$^+$) p-type shielding patterns 140a, 140b are formed in the drift region 120, for example, by ion implantation into portions exposed by the trenches 180. The deep shielding patterns 140a, 140b may be in electrical connection with the P-wells 170. A gate insulating layer 182 is formed on the bottom surface and sidewalls of each trench 180 (in FIG. 1A) or in alternating ones of the trenches 180 (in FIG. 1B, with source contacts 190b formed in the intervening trenches 180).

A gate electrode 184 (or "gate") is formed on each gate insulating layer 182 to fill the respective gate trenches 180. Vertical transistor channel regions (with conduction shown by dashed arrows) are defined in the P-wells 170 adjacent the gate insulating layer 182. Heavily-doped n$^+$ source regions 160 are formed in upper portions of the P-wells 170, for example, via ion implantation. Source contacts 190a, 190b are formed on the heavily-doped n-type source regions 160 and on the deep shielding patterns 140a, 140b. The source contacts 190a, 190b may be ohmic metal in some embodiments. A drain contact 192 is formed on the lower surface of the substrate 110. A gate contact (not shown) may be formed on each gate electrode 184.

In the examples of FIGS. 1A and 1B, the deep buried p-type semiconductor regions or shielding patterns 140a, 140b are configured to prevent degradation of the trench MOSFET 100a, 100b at high electric fields, but may also limit the active conducting area of the device 100a, 100b. In particular, in the example devices 100a and 100b, the shielding patterns 140a, 140b at the bottom and at one side 178 (in FIG. 1A) or at both sides 178 (in FIG. 1B) of the gate trenches 180 are configured to provide the voltage and/or current blocking by connections to respective source contacts 190a, 190b, which are connected to ground. Shielding connection patterns (not shown) may be connected to the source contacts 190 at the top of the device 100a, 100b to allow the deep shielding patterns 140 to be electrically grounded.

In FIG. 1A, the shielding patterns 140a are offset towards the source contacts 190 at one side of the trench 180, and extend to the lower corner regions of the gate trenches 180. As the gate insulating layer 182 may be particularly susceptible to breakdown at the corner regions, the shielding patterns 140a may help protect the gate insulating layer 182 at lower corner regions of the gate trenches 180 from high electric fields during reverse blocking operation.

Embodiments of the present invention are directed to power semiconductor devices including layouts and design arrangements that further improve reliability by shifting the peak electric field distribution away from one or more areas of the device that may be more susceptible to breakdown, such as portions of the gate insulating layer at the corners of the gate trench. In some embodiments, this may be achieved by forming the upper portion of the drift region that is under and/or adjacent the gate electrodes (also referred to herein as the "JFET region") with varying doping characteristics along a direction in which adjacent gate electrodes are separated from one another. For example, in trenched vertical power semiconductor devices, the JFET region may include the upper portions of the drift region that are between adjacent gate trenches and under the well regions.

Forming regions of varying doping characteristics may pose challenges when trenched vertical power devices are fabricated in silicon carbide or other wide bandgap semiconductor materials. Methods for doping a semiconductor material with n-type and/or p-type dopants include (1) doping the semiconductor material during the growth thereof, (2) diffusing the dopants into the semiconductor material, and (3) using ion implantation to selectively implant the dopants in the semiconductor material. When silicon carbide is doped during epitaxial growth, the dopants tend to unevenly accumulate, and hence the dopant concentration may vary (for example, by ±15%), which can negatively affect device operation and/or reliability. Additionally, doping by diffusion may not be desirable in silicon carbide, gallium nitride and various wide bandgap semiconductor devices, since n-type and p-type dopants tend to not diffuse well (or at all) in there materials, even at high temperatures.

In some embodiments, high-energy ion implantation and/or other methods may be used to vary the respective dopant concentrations of the upper portions of the drift region between the gate trenches (e.g., in a non-uniform or asymmetric distribution) along a lateral direction in which the gate trenches are spaced apart (referred to herein with reference to the x-direction). Dopant concentrations or concentration gradients described herein may vary in a stepwise or continuous (e.g., linear or exponential) fashion in or along the lateral direction. Responsive to an applied voltage, this variation in dopant concentration in the x-direction can provide an asymmetric distribution of the electric field between adjacent gate trenches. For example, during reverse blocking operation, the peak electric field distribution may be shifted away from the lower corners of the gate trenches. Accordingly, power MOSFETs and other gate-controlled devices according to embodiments of the present invention may exhibit improved reliability.

In some embodiments, the upper portion of the drift layer (including the JFET region) may be relatively lightly-doped during epitaxial growth to provide a reduced doping concentration. For example, in an n-channel device, the JFET region is doped n-type. Portions of the JFET region adjacent the gate trench may have a reduced n-type doping concentration, e.g., by more lightly n-type doping the upper portion of the semiconductor layer structure during epitaxial growth. The reduced n-type dopant concentration of the JFET region may protect the gate insulating layer at the lower corner of the gate trench from breakdown. However, by reducing the dopant concentration, the more lightly-doped JFET region may exhibit increased resistance during on-state operation. To compensate for the increase in resistance, portions of the JFET may be formed with an increased dopant concentration of the same conductivity type as the drift layer (referred to herein as conduction enhancing regions). In some embodiments, the conduction enhancing regions having the higher dopant concentration may be selectively formed in the portions of the drift region between the gate trenches that are laterally spaced apart from the corners of the gate trenches, for example, using high-energy ion implantation. As such, (i) the electric field strength adjacent the gate trench corners may be reduced, and (ii) the peak electric field strength may be substantially maintained or improved, but shifted away from the gate trench corners. Improvements in reliability of power MOSFETs and other gate-controlled devices according to embodiments of the present invention may thereby be achieved while maintaining or improving device performance.

Figure 2:
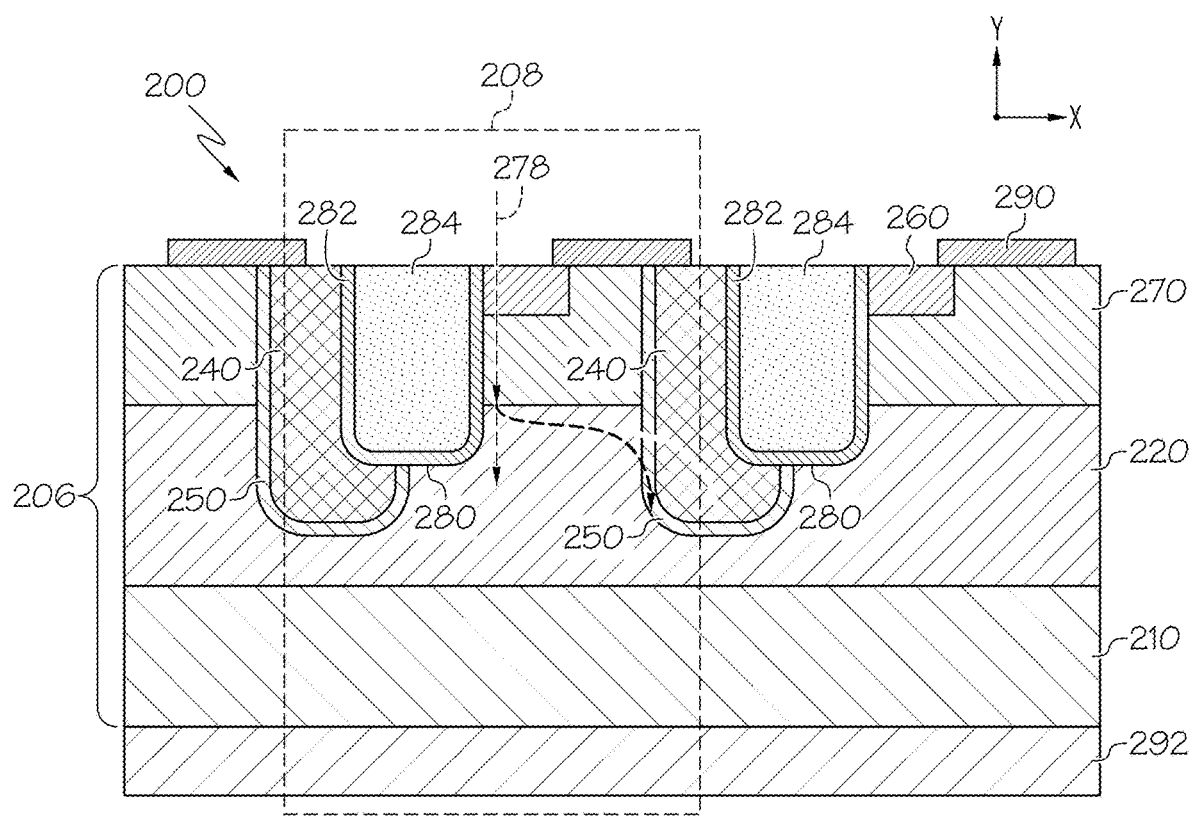
FIG. 2 is a schematic cross-sectional view illustrating an example of a gate trench power semiconductor device including shielding regions and aligned conduction enhancing regions between gate trenches in accordance with some embodiments of the present invention.

FIG. 2 is a schematic cross-sectional view illustrating an example of a gate trench power semiconductor device (shown by way of example as a power MOSFET 200) including shielding regions 240 and aligned conduction enhancing regions 250 between gate trenches 280 in accordance with some embodiments of the present invention. As shown in FIG. 2, the power MOSFET 200 includes an active region and a termination region (not shown) that surrounds the active region. The active region of the power MOSFET 200 includes a plurality of unit cells 208 that are electrically connected in parallel. An example unit cell 208 is illustrated by the dashed rectangle. The power MOSFET 200 may include more unit cells 208 than the approximately two unit cells 208 shown in FIG. 2. It will also be appreciated that a plurality of power MOSFET 200 may be grown on a single wafer.

The power MOSFET 200 includes a heavily-doped (N$^+$) n-type wide bandgap semiconductor substrate 210. The substrate 210 may include, for example, a single crystal silicon carbide semiconductor substrate. The substrate 210 may be doped with n-type impurities (e.g., an N$^+$ silicon carbide substrate). The impurities may include, for example, nitrogen or phosphorous. The dopant concentration of the substrate 210 may be, for example, between about $1\times10^{18}$ atoms/cm$^3$ and $1\times10^{21}$ atoms/cm$^3$ although other doping concentrations may be used. The substrate 210 may be any appropriate thickness (e.g., between 100 and 500 microns thick in some embodiments).

A lightly-doped (N$^-$) n-type drift layer or region 220 (e.g., a silicon carbide drift region) is provided on the substrate 210. The dopant concentration of the drift region 220 may be, for example, between about $1\times10^{14}$ atoms/cm$^3$ to about $1\times10^{16}$ atoms/cm$^3$, e.g., about $5\times10^{14}$ atoms/cm$^3$ to about $5\times10^{15}$ atoms/cm$^3$ or about $7\times10^{14}$ atoms/cm$^3$ to about $1\times10^{15}$ atoms/cm$^3$, although other doping concentrations may be used. The drift region 220 may be formed by epitaxial growth on the substrate 210. The drift region 220 may be a relatively thick region, having a vertical height above the substrate 210 of, for example, about 3 microns to about 100 microns. In some embodiments, the drift region 220 may include a more heavily-doped current spreading layer (e.g., an (N$^+$) n-type current spreading layer) between the upper portion of the drift region 220 and the substrate 210. A moderately-doped p-type layer is formed (for example, by epitaxial growth or implantation) on the drift region 220 and acts as the p-type well regions or P-wells 270 for the device 200. In some embodiments, the p-type well regions 270 may have a depth (relative to an upper surface of the drift layer 220) of less than about 1 micrometer (μm), for example about 0.8 μm or less. A heavily-doped N$^+$ layer is formed in upper portions of the moderately-doped p-type layer, for example, via ion implantation, to act as the source regions 260 for the device 200. In some embodiments, the source regions 260 may have a depth (relative to an upper surface of the drift layer 220) of less than about 0.5 μm, for example about 0.3 μm or less. The length of the channel regions may be defined between the lower boundary of the source regions 260 and the lower boundary of the P-wells 270. In some embodiments, the channel length may be about 1 μm or less, for example, about 0.5 μm.

The substrate 210, drift region 220 (including current spreading layer) and the moderately doped p-type layer or P-wells 270, along with the various regions/patterns formed therein, define a semiconductor layer structure 206 of the power MOSFET 200. The semiconductor layer structure 206 may include one or more wide bandgap semiconductor materials. A plurality of gate trenches 280 extend parallel to one another in a longitudinal direction in the semiconductor layer structure 206. The gate trenches 280 are spaced apart from one another along a direction (e.g., the lateral or x-direction) that crosses (e.g., is perpendicular to) the longitudinal direction, with portions of the drift layer or JFET region 220 therebetween. A gate insulating layer 282 is provided on the bottom surface and sidewalls of each gate trench 280, and a gate electrode or gate 284 is provided on the gate insulating layer 282 to fill the respective gate trenches 280. Source contacts 290 are formed on the source regions 260, and may be ohmic metal in some embodiments.

A drain contact 292 is formed on the lower surface of the substrate 210. A gate contact (not shown) may be formed on each gate electrode 284.

Still referring to FIG. 2, shielding patterns 240 extend into the drift layer 220 beyond (and in the example of FIG. 2, underneath a bottom surface and corner of) the gate trenches 280. In some embodiments, the shielding patterns 240 may extend into the drift layer 220 by more than about 1 µm, for example by about 1.5 µm or more. The shielding patterns 240 are of the opposite conductivity type to the drift region 220. In particular, in the device 200, heavily-doped (P+) p-type shielding patterns 240 are formed in the drift region 220, e.g., by ion implantation. For example, the shielding patterns 240 may be formed by implanting a p-type dopant (such as aluminum (Al)) with a concentration of between about $1 \times 10^{15}$ atoms/cm$^3$ and $1 \times 10^{19}$ atoms/cm$^3$, for example, $1 \times 10^{17}$ atoms/cm$^3$ or more. The portions of the shielding patterns 240 under the respective gate trenches 280 may be electrically connected, for example, by shielding connection patterns (not shown).

The shielding patterns 240 are configured to prevent degradation of the trench MOSFET 200 at high electric fields. For example, as corner regions of the gate insulating layer 282 may be susceptible to breakdown, the shielding patterns 240 may help protect the corner regions of the gate insulating layer 282 from high electric fields, such as during reverse blocking operation. In the example of FIG. 2, the shielding patterns 240 extend along one sidewall and under one corner of each gate trench 280; that is, the shielding patterns 240 are offset towards the source contacts 290 relative to the gate trenches 280, and extend to the lower corner regions of the gate trenches 280. More generally, however, shielding patterns as described herein may extend between and/or under the gate trenches, e.g., along at least one sidewall and/or along the bottom of a respective gate trench. The absence of the shielding patterns 240 on the sidewall 278 of the gate trench 280 allows for (here, n-type) channel regions and conduction (shown by dashed arrows in FIG. 2) along one sidewall 278.

As noted above, in embodiments of the present invention, the dopant concentration of the drift region 220 may be reduced, for example, to between about $1 \times 10^{14}$ atoms/cm$^3$ to about $1 \times 10^{16}$ atoms/cm$^3$, e.g., about $5 \times 10^{14}$ atoms/cm$^3$ to about $5 \times 10^{15}$ atoms/cm$^3$ or about $7 \times 10^{14}$ atoms/cm$^3$ to about $1 \times 10^{15}$ atoms/cm$^3$, which may reduce the electric field strength at the corners of the gate trenches 280 and thus the likelihood of breakdown of the gate insulating layers 282, but at the expense of increased resistance. To compensate, conduction enhancing regions 250 are formed in portions of the drift region 220 between gate trenches 280 (i.e., in the JFET region). The conduction enhancing regions 250 are of the same conductivity type as the drift region 220 and are separated or spaced apart from the gate trenches 280 and/or corners thereof in the lateral direction. In particular, in the example device 200 of FIG. 2, n-type conduction enhancing regions 250 are formed in the portions of drift region 220 between the gate trenches 280, e.g., by ion implantation. For example, the conduction enhancing regions 250 may be formed by implanting an n-type dopant (such as nitrogen (N)) with a concentration of between about $1 \times 10^{15}$ atoms/cm$^3$ and $1 \times 10^{17}$ atoms/cm$^3$ or more, for example, between about $2 \times 10^{16}$ atoms/cm$^3$ and $8 \times 10^{16}$ atoms/cm$^3$, e.g., about $5 \times 10^{16}$ atoms/cm$^3$. The conduction enhancing regions 250 may extend along at least one side and/or along a bottom/lower boundary of the shielding patterns 240. The conduction enhancing regions 250 may extend into the drift region 220 through the wells 270 and/or beyond the bottom/lower boundary of the shielding patterns 240.

The dopant concentration of the conduction enhancing regions 250 may thus be of the same conductivity type as but greater or higher than the dopant concentration of the drift region 220 (and in particular, higher than the dopant concentrations of portions of the drift region 220 along corners of the gate trenches 280 or gate insulating layers 282. In some embodiments the dopant concentration of the conduction enhancing regions 250 may be greater than that of the drift region 220 by about 2 times or more, for example, about 3 times or more, about 5 times or more, about 10 times or more, or about 20 times or more. As such, the (in this example, n-type) dopant concentration of portions of the drift layer 220 between gate trenches 280 may vary (e.g., with a non-uniform dopant distribution or concentration gradient between a first concentration proximate the corners of the gate trenches 280 and a second, higher concentration of the regions 250) along the direction in which the gate trenches 280 are spaced apart from one another (e.g., in the x-direction in FIG. 2), which may shift the peak electric field distribution away from the corners of the gate trenches 280 under applied voltage, for example, during reverse blocking operation. That is, the dopant concentrations of the JFET portions of the drift region 220 may vary in a stepwise or continuous (e.g., linear or exponential) fashion along the x-direction in the drift layer 220. For example, the dopant concentration may be constant, substantially uniform, or symmetrically varying in portions of the drift region 220 between the gate trenches 280, and may include a gradient or stepwise increase at an interface or boundary between the drift region 220 and the conduction enhancing regions 250, as shown for example by the various non-uniform dopant distributions of FIGS. 4D, 7B, and 10B.

That is, the peak electric field during reverse blocking operation may be shifted away from the middle or central portion of the JFET region and toward the shielding pattern 240, due to the presence of the more highly doped n-type conduction enhancing region 250 along the periphery of the p-shielding pattern 240. The lower corner of the gate trench 280 (which is exposed by the shielding pattern 240) thus experiences lower electric field values during reverse blocking operation. The more highly-doped n-type portion 250 of the JFET region provides a lower resistance current path (shown by the bolded and dashed arrow in FIG. 2) during on-state operation, helping to compensate for the increased resistance in the remainder of the JFET region due to the more lightly doped epitaxial layer 220. The dopant concentration of the conduction enhancing region 250 may be less or lower than the dopant concentration of the substrate 210 and/or any current spreading layers (e.g., layer 1530 in FIG. 15) between the upper portion of the drift region 220 and the substrate 210. In some embodiments, the relative dopant concentrations of the drift layer 220 and the conduction enhancing regions 250 may be selected or otherwise configured to provide blocking voltages of about 300 V up to about 15 kV or more.

FIGS. 3A-3F are schematic cross-sectional views illustrating example operations for fabricating the gate trench power semiconductor device 200 of FIG. 2 with aligned shielding patterns 240 and conduction enhancing regions 250 according to some embodiments of the present invention. As shown in FIG. 3A, ion implantation is used to more heavily dope a portion 250 of the drift region 220, defining the conduction enhancing regions 250 in portions of the drift region 220 between gate trenches 280 (to be formed in subsequent operations). For example, after forming the lightly-doped (N⁻) n-type drift layer or region 220 (e.g. by epitaxial growth on the substrate 210) and the moderately-doped p-type well regions 270 (e.g., by epitaxial growth or implantation), a first mask 301 (e.g., an oxide mask) may be formed to expose a surface of the drift region 220. A first ion implantation process may be performed to implant dopants of the same conductivity type as the drift region 220 into the surface exposed by the first mask 301 to define the conduction enhancing regions 250 extending through the P-wells 270 and into the drift region 220. As noted above, in some embodiments the conduction enhancing regions 250 may be formed by implanting an n-type dopant (such as nitrogen) with a concentration of between about $1 \times 10^{15}$ atoms/cm³ and $1 \times 10^{17}$ atoms/cm³, for example, $5 \times 10^{16}$ atoms/cm³⁺ to define lightly doped N⁻ conduction enhancing regions 250 having a higher dopant concentration than the N⁻ drift layer 220. The energy of the first implantation process may be controlled to provide the lower boundaries of the conduction enhancing regions 250 at a desired depth (relative to the surface of the drift region 220).

In FIG. 3B, a second ion implantation process may be performed to define shielding patterns 240 extending through the P-wells 270 and into the drift layer 220. For example, after forming the conduction enhancing regions 250 and using the same mask 301, the second ion implantation process may be performed to implant dopants of the opposite conductivity type as the drift region 220 into the surface exposed by the mask 301 to define the shielding patterns 240 extending through the P-wells 270 and into the drift region 220. As noted above, the shielding patterns 240 may be formed by implanting a p-type dopant (such as aluminum) with a concentration of between about $1 \times 10^{15}$ atoms/cm³ and $1 \times 10^{19}$ atoms/cm³, for example, $1 \times 10^{17}$ atoms/cm³ or more, cm³, to define the P+ shielding patterns 240. The shielding patterns 240 are thus aligned with the conduction enhancing regions 250, which extend along opposing sides and under opposing corners of the shielding patterns in the example of FIGS. 3A-3F.

While illustrated by way of example as being formed after the conduction enhancing regions 250 in FIGS. 3A and 3B, it will be understood that the order of these operations may be reversed; that is, the shielding patterns 240 may be formed before the conduction enhancing regions 250 in some embodiments. Likewise, in some embodiments, the conduction enhancing regions 250 and/or shielding patterns 240 can be formed before forming the P-wells 270 in the drift region 220. More generally, elements/layers/regions may be formed in an order different from those shown by way of example in the fabrication operations described herein.

As shown in FIG. 3C, the first mask 301 may be removed and a second mask 302 may be formed to cover or protect the shielding patterns 240 and the conduction enhancing regions 250 and expose a surface of the P-well 270 adjacent thereto, and a third ion implantation process is performed to define heavily-doped N⁺ source regions 260 in upper portions of the P-wells 270. In some embodiments, additional heavily-doped P+ regions (not shown) may be formed in the upper portions of in the P-wells 270 adjacent the N⁺ source regions 260, for example, via ion implantation using an additional masking operation (not shown) to protect the N⁺ source regions 260 and the shielding patterns 240 and the conduction enhancing regions 250. In some embodiments, implant activation and/or other additional processes may be performed to recover or repair damage caused by the implantation process(es).

Referring now to FIG. 3D, further masking operations may be performed to define gate trenches 280 in the semiconductor layer structure 206. The gate trenches 280 extend through the P-wells 270 and into the drift layer 220. The gate trenches 280 may be formed with 'striped' gate trench layouts, in which the trenches 280 extend (continuously or in segments) in parallel to one another in a longitudinal direction, and are spaced apart in a direction crossing (e.g., perpendicular to) the longitudinal direction. For example, an etching process may be performed to etch the surface of the semiconductor layer structure 206 exposed by respective trench-shaped openings in a gate mask (not shown) to define the gate trenches 280. The etching process may be an anisotropic etch that removes portions of the p-type well layer 270 and/or the drift region 220 to form the gate trenches 280. The etching process may be controlled such that a depth or bottom surface of the trenches 280 are confined above and do not extend beyond the shielding patterns 240 and/or conduction enhancing regions 250.

Still referring to FIG. 3D, a gate insulating layer 282 may be formed on the bottom surface and sidewalls of each gate trench 280, and a gate electrode 284 is formed on the gate insulating layer 282 to fill the respective gate trenches 280. As shown in FIG. 3E, an intermetal dielectric (IMD) layer 286 may be formed on the gate 284, and source contacts 290 (not shown) may be formed on the source regions 260. The source contacts 290 may be ohmic metal in some embodiments. In FIG. 3F, an overlay process may be performed to form layer 303 on the surface of the semiconductor layer structure 206. A drain contact 292 (not shown) may be formed on the lower surface of the substrate 210.

Figure 4A:
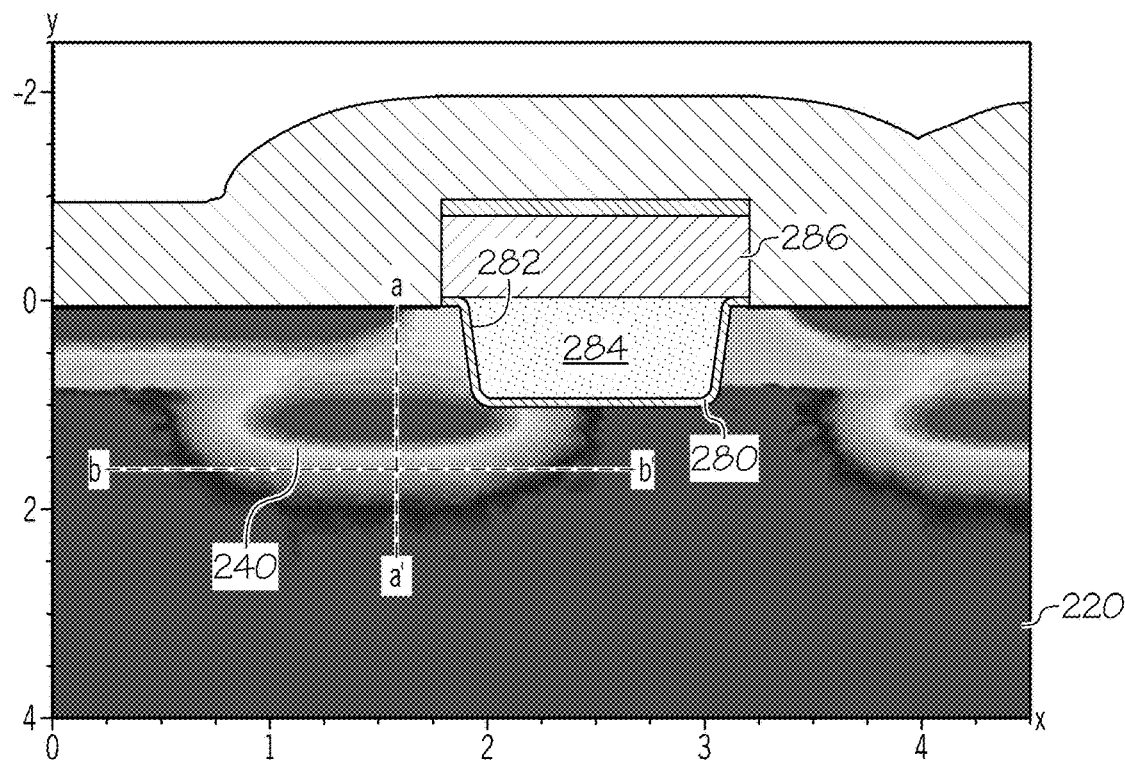
FIGS. 4A, 4B, 4C, and 4D are graphical illustrations of varying p-type and n-type dopant concentrations in the JFET regions of the gate trench power semiconductor device of FIG. 2.
Figure 4B:
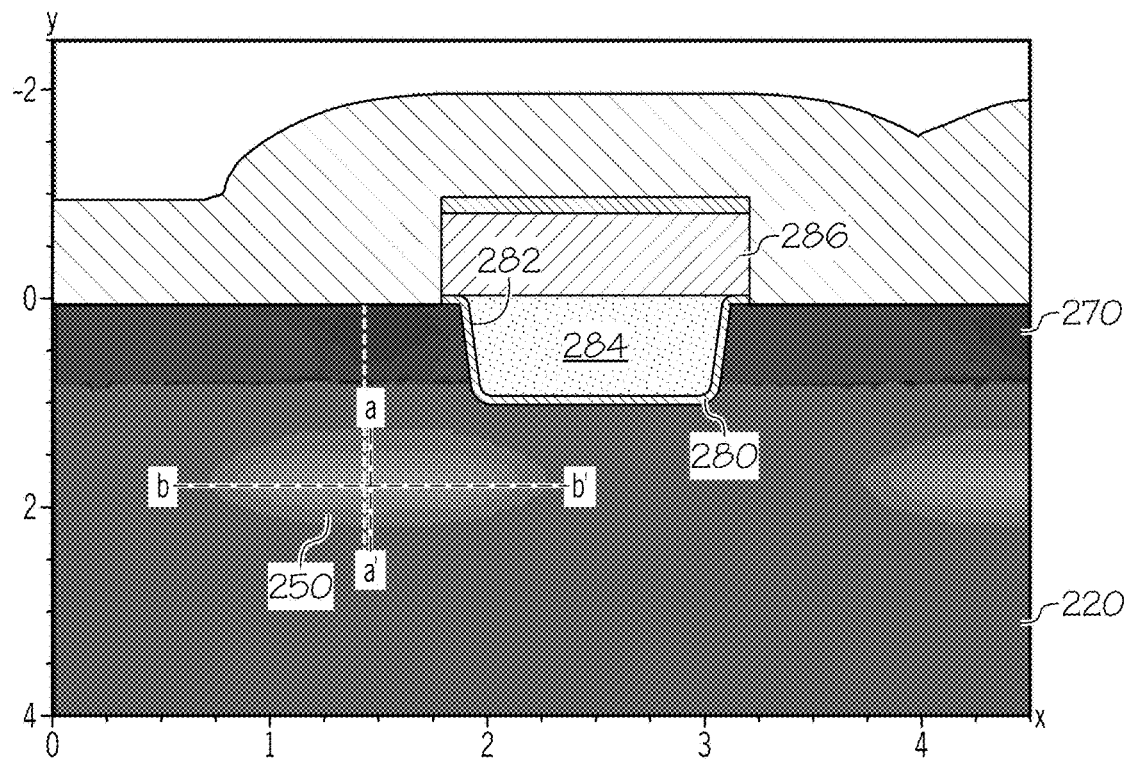
Figure 4C:
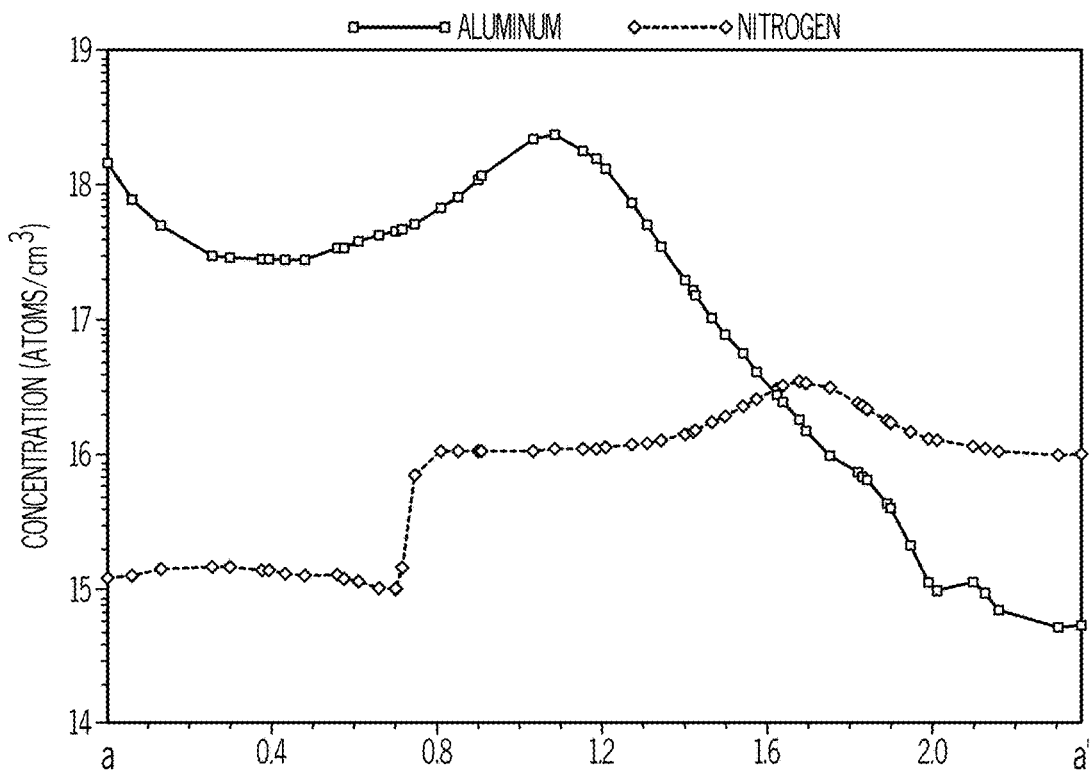
Figure 4D:
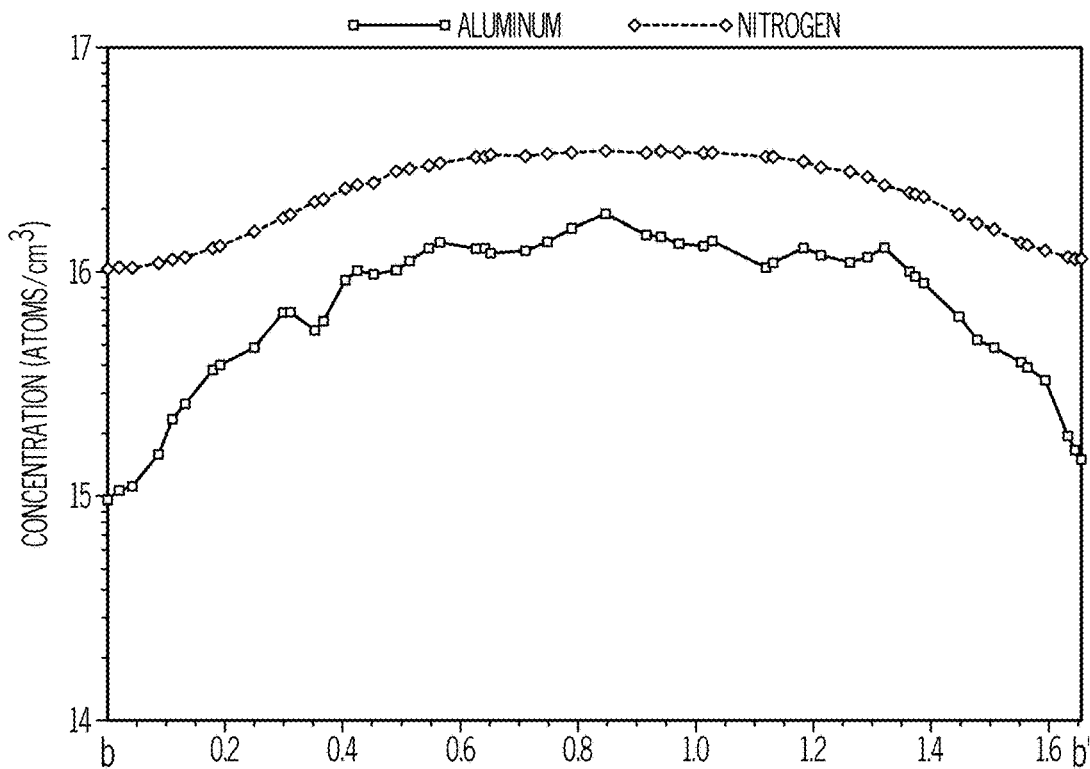

FIGS. 4A and 4B are graphical illustrations of p-type dopant (shown with reference to Al dopants by way of example) and n-type dopant (shown with reference to N dopants by way of example) concentrations in the JFET regions of the gate trench power semiconductor device of FIG. 2, respectively, along both the depth (y-) and the lateral (x-) directions. FIGS. 4C and 4D illustrate the dopant concentrations along lines a-a' (i.e., in the depth or y-direction) and b-b' (i.e., in the lateral or x-direction), respectively. As shown in FIGS. 4A, and 4C, the Al dopant distribution extends into the drift region 220 to a depth of about 2 μm, with a peak at a depth of about 1.2 μm, which may correspond to the peak dopant concentration of the shielding pattern 240. As shown in FIGS. 4B and 4C, the N dopant distribution extends into the drift layer 220 to a depth of beyond about 2 μm, with a peak at a depth of about 1.7 μm, which may correspond to the peak dopant concentration of the conduction enhancing region 250.

As shown in FIGS. 4A and 4D, the Al dopant distribution laterally varies in the drift region 220 over a width of about 2 μm between the gates 284, with a peak at a distance of about 0.85 μm. FIGS. 4B and 4D illustrate that the N dopant distribution likewise laterally varies in the drift region 220 over a similar width and with a similar peak as the Al dopant distribution. That is, in this example, the N dopant distribution of the conduction enhancing region 250 is generally aligned with the Al dopant distribution of the shielding pattern 240 in the lateral direction between gates 284. The peak N dopant concentration of the conduction enhancing region 250 may be higher than the N dopant concentration of the drift region 220 adjacent the corners of the gate insulating layer 282 by factor of about 2 or more, for example, about 3 or more, about 5 or more, about 10 or more or about 20 or more, which may shift the peak of the electric field distribution under applied voltage away from the corners of the gate insulating layer 282. Although described herein with reference to N and Al as n-type and p-type dopants, respectively, it will be understood that embodiments are not limited to these specific dopants, and other n-type dopants (for example, phosphorous (P)) and p-type dopants (for example, boron (B)) may be used.

Figure 5:
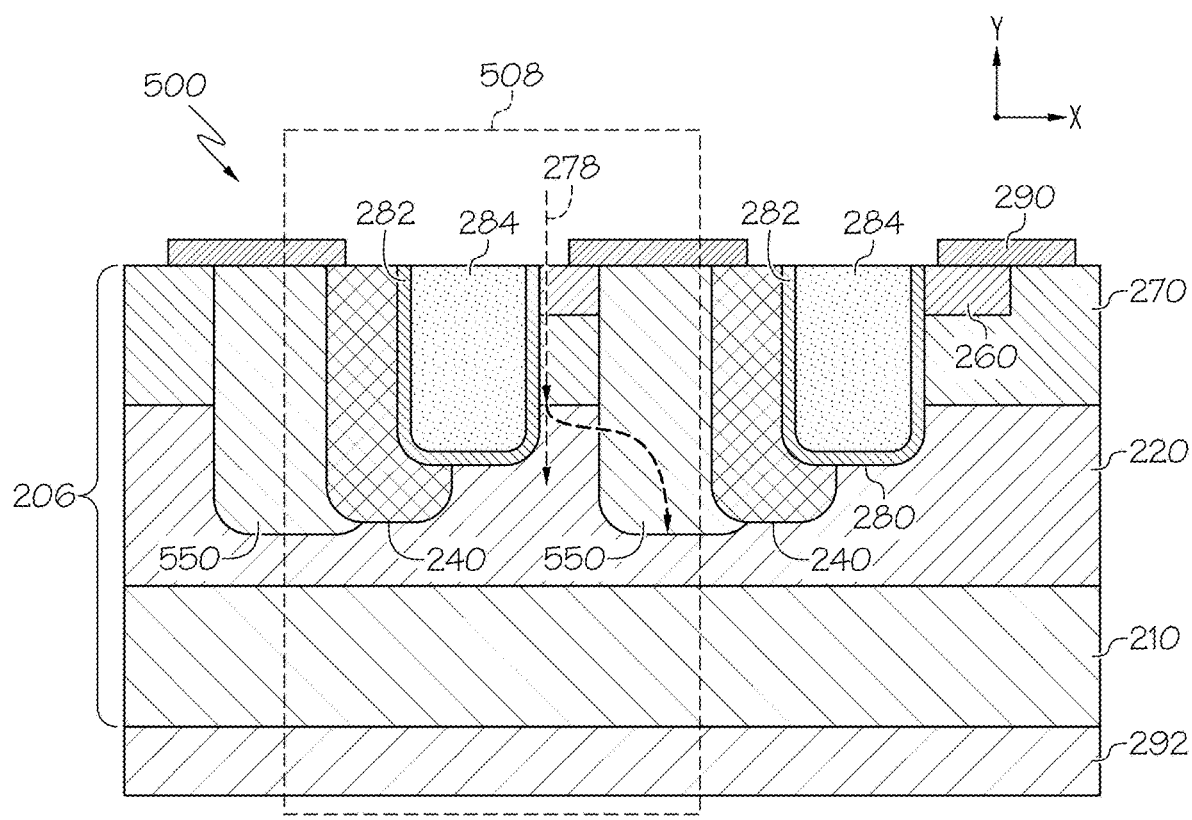
FIG. 5 is a schematic cross-sectional view illustrating an example of a gate trench power semiconductor device including shielding regions and offset conduction enhancing regions between gate trenches in accordance with some embodiments of the present invention.

FIG. 5 is a schematic cross-sectional view illustrating an example of a gate trench power semiconductor device (shown by way of example as a power MOSFET 500) including shielding regions 240 and offset conduction enhancing regions 550 between gate trenches 280 in accordance with some embodiments of the present invention. Some elements of the power MOSFET 500 may be similar to those of the power MOSFET 200 of FIG. 2, and thus detailed description of such similar elements may be omitted for brevity.

As shown in FIG. 5, the power MOSFET 500 includes a plurality of unit cells 508 that are electrically connected in parallel. An example unit cell 508 is illustrated by the dashed rectangle, but it will be understood that the power MOSFET 500 may include more unit cells 508 than the approximately two unit cells shown in FIG. 5.

As in the power MOSFET 200 of FIG. 2, the power MOSFET 500 includes a heavily-doped (N+) n-type wide bandgap semiconductor substrate 210, a lightly-doped (N−) n-type drift layer or region 220, moderately-doped p-type well regions or P-wells 270, and a heavily-doped N+ source regions 260. A plurality of gate trenches 280 (each including a gate insulating layer 282 on the bottom surface and sidewalls thereof, and gate electrode 284 therein) extend parallel to one another in a longitudinal direction in the semiconductor layer structure 206, and are spaced apart from one another along a direction (e.g., the x-direction) that crosses (e.g., is perpendicular to) the longitudinal direction, with portions of the drift layer or JFET region 220 therebetween. Shielding patterns 240 of the opposite conductivity type as the drift region 220 extend into the semiconductor layer structure 206 along one sidewall and under one corner of each gate trench 280, and may help protect the gate insulating layer 282 at the corner of the gate trench 280 from high electric fields, such as during reverse blocking operation. The absence of the shielding patterns 240 on the other sidewall 278 of the gate trench 280 allows for (here, n-type) channel regions and conduction (shown by dashed arrows in FIG. 5) along one sidewall 278.

As noted above, the drift region 220 is relatively lightly doped to protect or reduce the likelihood of breakdown of the gate insulating layers 282 at the corners of the gate trenches 280. To compensate for the reduced dopant concentration (and thus increased resistance) of the drift region 220, conduction enhancing regions 550 of the same conductivity type as but with a higher dopant concentration than the drift region 220 are formed in portions of the drift region 220 between gate trenches 280 (i.e., in the JFET region). In the example device 500 of FIG. 5, n-type conduction enhancing regions 550 are formed in the portions of drift region 220 between the gate trenches 280, e.g., by ion implantation, but are offset from the p-type shielding patterns 240 in the lateral or x-direction (e.g., towards the gate trenches 280). The more highly-doped n-type portion 550 of the JFET region provides a lower resistance current path (shown by the bolded and dashed arrow in FIG. 5). As such, the (in this example, n-type) dopant concentration of portions of the drift region 220 between gate trenches 280 may vary (e.g., with a non-uniform dopant distribution or concentration gradient) along the direction in which the gate trenches 280 are spaced apart from one another (e.g., in the x-direction in FIG. 5), which may shift the peak electric field distribution away from the corners of the gate trenches 280 under applied voltage, for example, during reverse blocking operation.

Figure 7A:
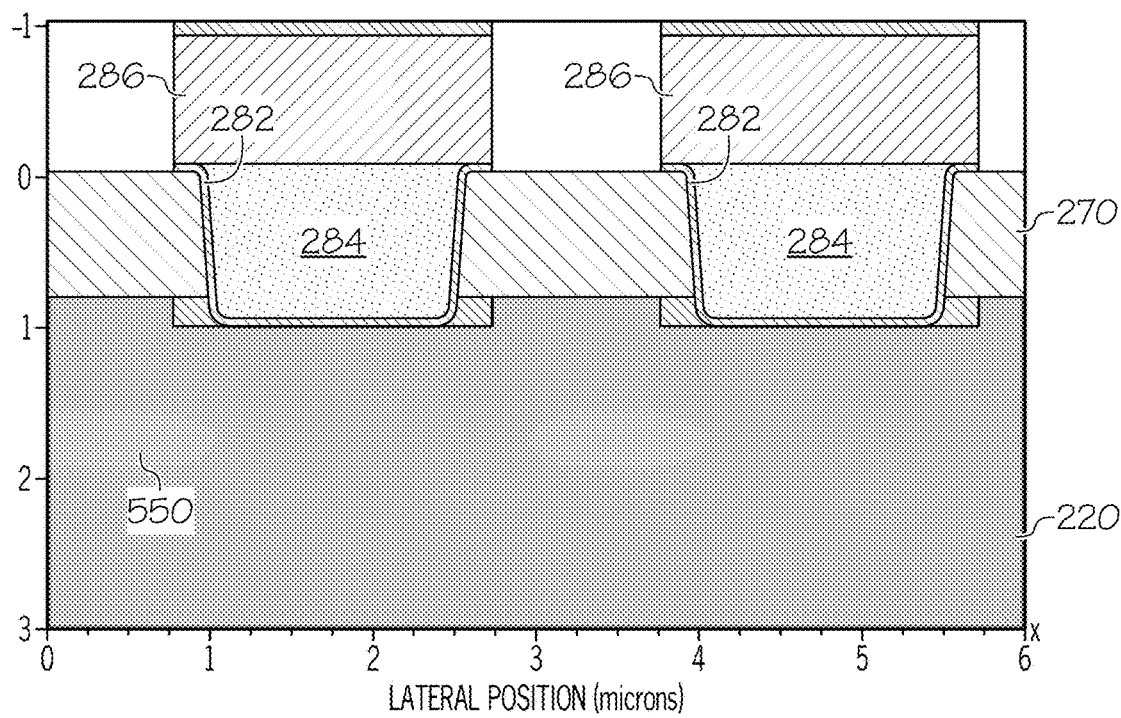
FIGS. 7A and 7B are graphical illustrations of varying n-type dopant concentrations in the JFET regions of the gate trench power semiconductor device of FIG. 5.
Figure 7B:
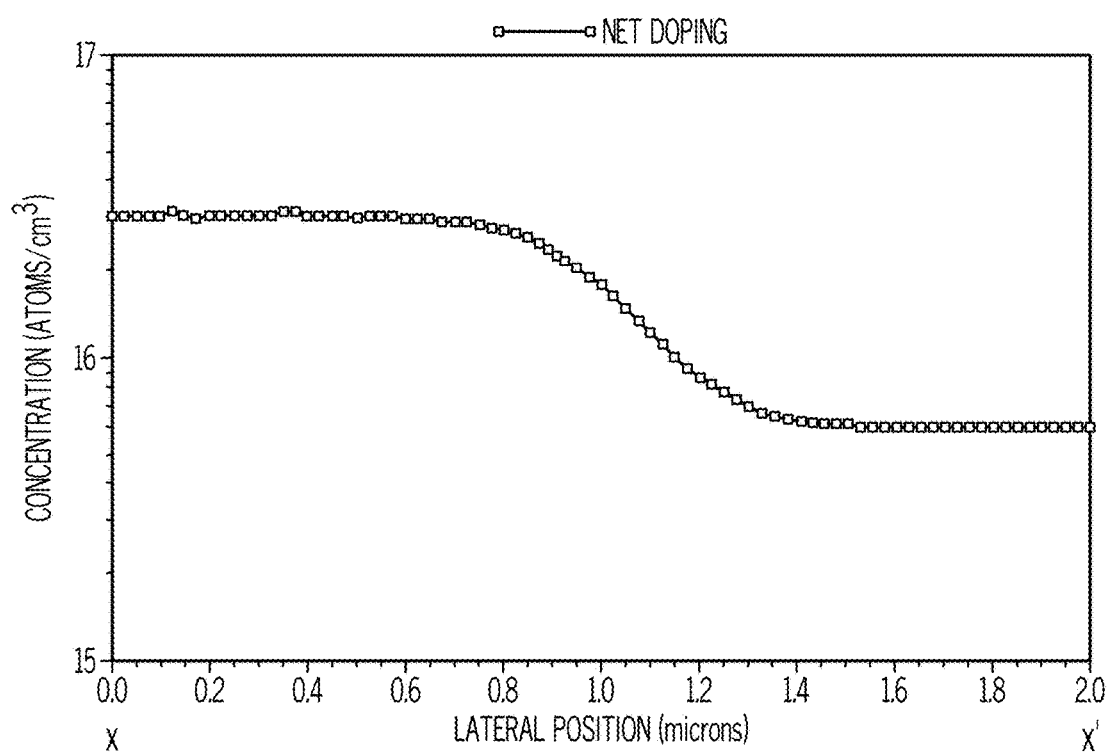

Thus, the dopant concentrations of the JFET region of the drift region 220 may vary in a stepwise or continuous (e.g., linear or exponential) fashion along the x-direction in the drift layer 220, for example, with a constant, substantially uniform, or symmetrically varying concentration in the drift region 220 and a gradient or stepwise increase at an interface or boundary between the drift region 220 and the conduction enhancing regions 550, as shown for example in FIG. 7B. The conduction enhancing regions 550 may extend along at least one side and/or a bottom/lower boundary of the shielding patterns 240, and are laterally spaced apart from the gate trenches 280. The conduction enhancing regions 550 may extend into the drift region 220 through the wells 270 and/or beyond the bottom/lower boundary of the shielding patterns 240. The conduction enhancing regions 550 may otherwise be similar to the conduction enhancing regions 250 of FIG. 2.

FIGS. 6A-6F are schematic cross-sectional views illustrating example operations for fabricating the gate trench power semiconductor device of FIG. 5 with offset shielding patterns 240 and conduction enhancing regions 550 according to some embodiments of the present invention. As shown in FIG. 6A, ion implantation is used to more heavily dope a portion 550 of the drift region 220, defining the conduction enhancing regions 550 in portions of the drift region 220 between gate trenches 280 (to be formed in subsequent operations). For example, after forming the lightly-doped (N−) n-type drift layer or region 220 (e.g. by epitaxial growth on the substrate 210) and the moderately-doped p-type well regions 270 (e.g., by epitaxial growth or implantation), a first mask 601 (e.g., an oxide mask) may be formed to expose a surface of the drift region 220. A first ion implantation process may be performed to implant dopants of the same conductivity type as the drift region 220 into the surface exposed by the first mask 601 to define the conduction enhancing regions 550 extending through the P-wells 270 and into the drift region 220. The energy of the first implantation process may be controlled to provide the lower boundaries of the conduction enhancing regions 550 at a desired depth (relative to the surface of the drift region 220).

In FIG. 6B, a second ion implantation process may be performed to define shielding patterns 240 extending through the P-wells 270 and into the drift region 220. For example, after forming the conduction enhancing regions 550, the first mask 601 may be removed, a second mask 602 may be formed with an opening that is offset from that of the first mask 601, and the second ion implantation process may be performed to implant dopants of the opposite conductivity type as the drift region 220 into the surface exposed by the second mask 602 to define the shielding patterns 240. The shielding patterns 240 are thus offset from the conduction enhancing regions 550, which extend along one side and under one corner of the shielding patterns 240 in the example of FIGS. 6A-6F. In some embodiments, the order of masking and implantation operations in FIGS. 6A and 6B may be reversed, such that the shielding patterns 240 may be formed before the conduction enhancing regions 550.

As shown in FIG. 6C, the second mask 602 may be removed and a third mask 603 may be formed to cover or protect the shielding patterns 240 and the conduction enhancing regions 550 and expose a surface of the P well 270 adjacent thereto, and a third ion implantation process is performed to define heavily-doped N+ source regions 260 in upper portions of the P-wells 270. In some embodiments, additional heavily-doped P+ regions (not shown) may be formed in the upper portions of in the P-wells 270 adjacent the N+ source regions 260, for example, via ion implantation using an additional masking operation (not shown). Implant activation and/or other additional processes may be performed to recover or repair damage caused by the implantation process(es).

Referring now to FIG. 6D, further operations may be performed to define gate trenches 280 in the semiconductor layer structure 206 extending through the P-wells 270 and into the drift region 220, to form a gate insulating layer 282 on the bottom surface and sidewalls of each gate trench 280, and to form a gate electrode 284 on the gate insulating layer 282 to fill the respective gate trenches 280, in a manner similar to the operations discussed above with reference to FIG. 3D. As shown in FIG. 6E, an intermetal dielectric (IMD) layer 286 may be formed on the gate 284, and source contacts 290 (not shown) may be formed on the source regions 260. The source contacts 290 may be ohmic metal in some embodiments. In FIG. 6F, an overlay process may be performed to form layer 606 on the surface of the semiconductor layer structure 206, and a drain contact 292 (not shown) may be formed on the lower surface of the substrate 210.

FIGS. 7A and 7B are graphical illustrations of varying dopant concentrations in the JFET regions of gate trench power semiconductor device of FIG. 5 along the lateral (x-) direction. As shown in FIGS. 7A and 7B, the n-type dopant distribution in portions of the drift region between the gate trenches (i.e., in the JFET region) varies as a function of lateral position along the direction of separation of the adjacent gate trenches. The n-type dopant concentration of the conduction enhancing region 550 (e.g., $2\times10^{16}$ atoms/cm$^3$) may be higher than that of the portions of the drift region 220 (e.g. $6\times10^{15}$ atoms/cm$^3$) adjacent the corners of the gate insulating layer 282 (in some embodiments by factor of about 2 or more, for example, about 3 or more, about 5 or more, about 10 or more, or about 20 or more), and may thereby shift the peak of the electric field distribution under applied voltage away from the corners of the gate insulating layer 282. In the example of FIGS. 7A and 7B, the dopant distribution of the conduction enhancing region 550 is offset from the dopant distribution of the shielding pattern 240 (not shown) in the lateral direction between the gates/gate trenches.

Figure 8:
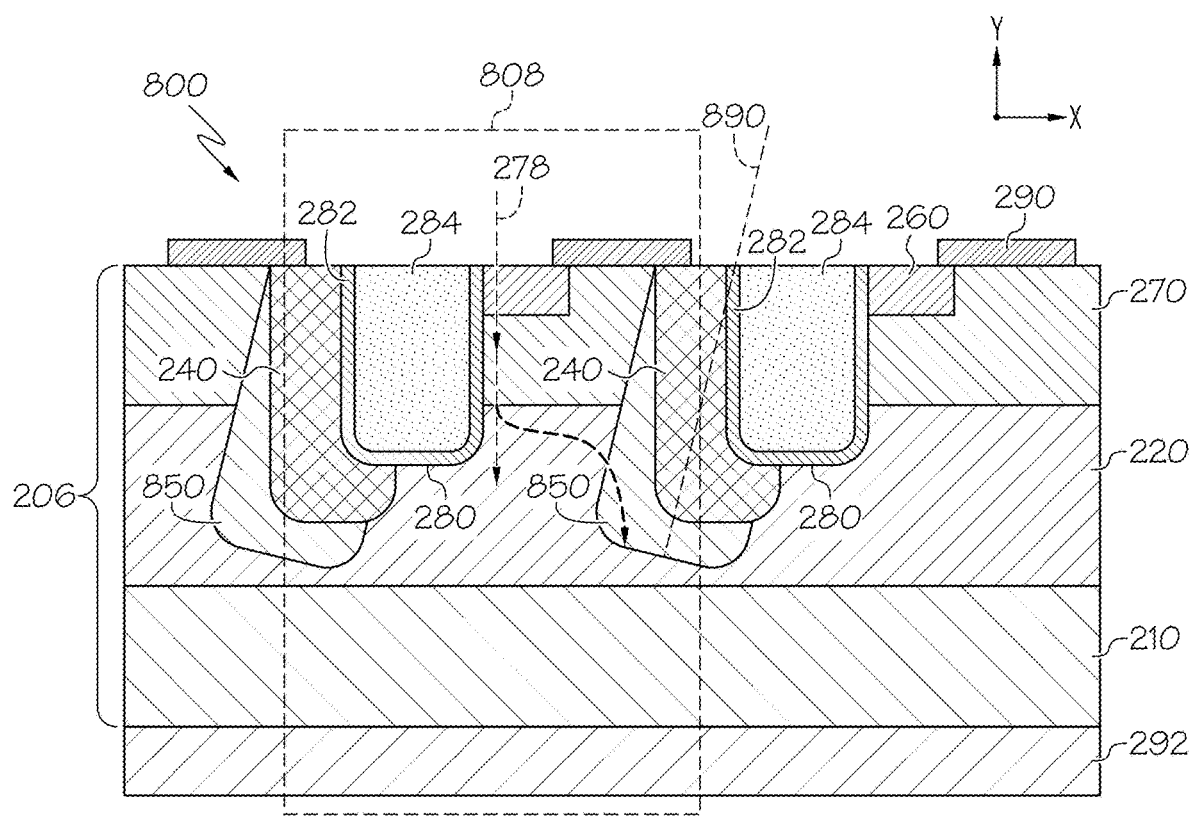
FIG. 8 is a schematic cross-sectional view illustrating an example of a gate trench power semiconductor device including shielding regions and angled conduction enhancing regions between gate trenches in accordance with some embodiments of the present invention.

FIG. 8 is a schematic cross-sectional view illustrating an example of a gate trench power semiconductor device (shown by way of example as a power MOSFET 800) including shielding regions 240 and angled or tilted conduction enhancing regions 850 between gate trenches 280 in accordance with some embodiments of the present invention. Some elements of the power MOSFET 800 may be similar to those of the power MOSFET 200 of FIG. 2, and thus detailed description of such similar elements may be omitted for brevity.

As shown in FIG. 8, the power MOSFET 800 includes a plurality of unit cells 808 that are electrically connected in parallel. An example unit cell 808 is illustrated by the dashed rectangle, but it will be understood that the power MOSFET 800 may include more unit cells 808 than the approximately two unit cells shown in FIG. 8.

As in the power MOSFET 200 of FIG. 2, the power MOSFET 800 includes a heavily-doped (N+) n-type wide bandgap semiconductor substrate 210, a lightly-doped (N−) n-type drift layer or region 220, moderately-doped p-type well regions or P-wells 270, and a heavily-doped N+ source regions 260. A plurality of gate trenches 280 (each including a gate insulating layer 282 on the bottom surface and sidewalls thereof, and gate electrode 284 therein) extend parallel to one another in a longitudinal direction in the semiconductor layer structure 206, and are spaced apart from one another along a direction (e.g., the x-direction) that crosses (e.g., is perpendicular to) the longitudinal direction, with portions of the drift layer or JFET region 220 therebetween. Shielding patterns 240 of the opposite conductivity type as the drift layer 220 extend into the semiconductor layer structure 206 along one sidewall and under one corner of each gate trench 280, and may help protect the gate insulating layer 282 at the corner of the gate trench 280 from high electric fields, such as during reverse blocking operation. The absence of the shielding patterns 240 on the other sidewall 278 of the gate trench 280 allows for (here, n-type) channel regions and conduction (shown by dashed arrows in FIG. 8) along one sidewall 278.

As noted above, the drift region 220 is relatively lightly doped to protect or reduce the likelihood of breakdown of the gate insulating layers 282 at the corners of the gate trenches 280. To compensate for the reduced dopant concentration (and thus increased resistance) of the drift region 220, conduction enhancing regions 850 of the same conductivity type as but with a higher dopant concentration than the drift region 220 are formed in portions of the drift region 220 between gate trenches 280 (i.e., in the JFET region). In the example device 800 of FIG. 5, n-type conduction enhancing regions 850 are formed in the portions of drift region 220 between the gate trenches 280, but with orientations that are angled or tilted relative to the p-type shielding patterns 240. That is, an axis 890 along which the distribution of dopants of the conduction enhancing regions 850 extend is non-orthogonal relative to the surface of the drift region 220. In the example of FIG. 8, the distribution of dopants of the conduction enhancing regions 850 non-uniformly extend along at least one side and a lower boundary of the shielding patterns 240.

As with the conduction enhancing regions 250 and 500, the more highly-doped n-type portion 850 of the JFET region provides a lower resistance current path (shown by the bolded and dashed arrow in FIG. 8). As such, the (in this example, n-type) dopant concentration of portions of the drift region 220 between gate trenches 280 may vary (e.g., with a non-uniform dopant distribution or concentration gradient) along the direction in which the gate trenches 280 are spaced apart from one another (e.g., in the x-direction in FIG. 8), which may shift the peak electric field distribution away from the corners of the gate trenches 280 under applied voltage, for example, during reverse blocking operation.

Figure 10A:
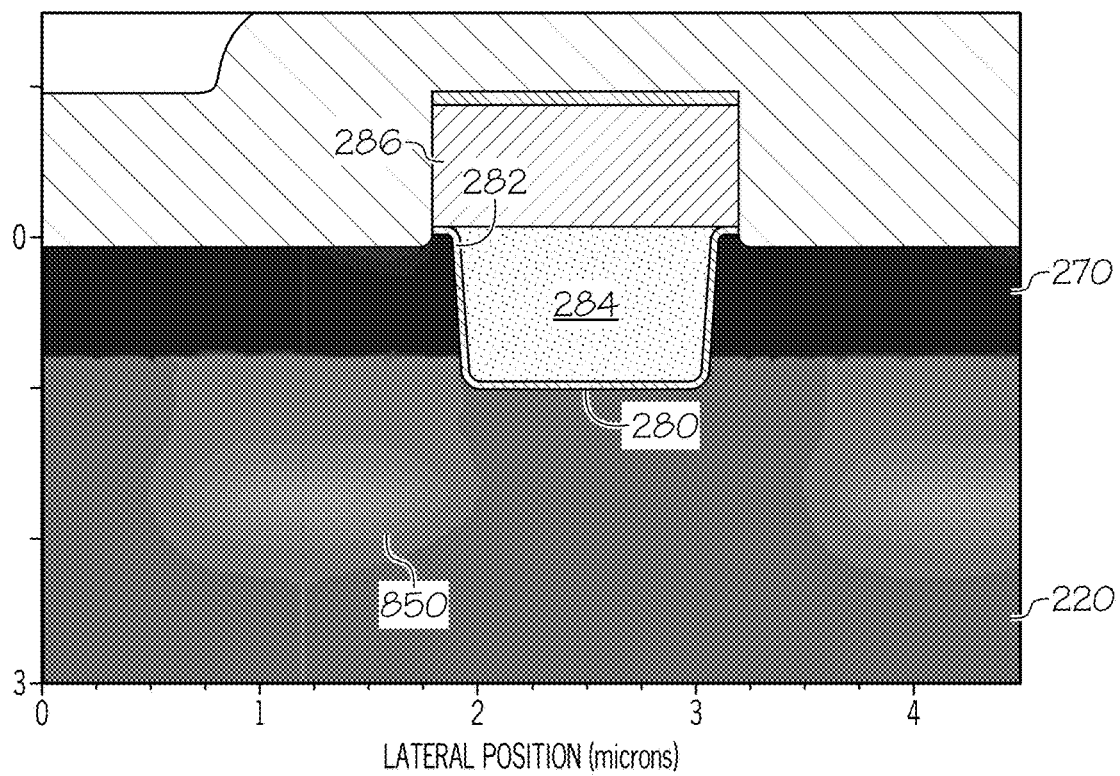
FIGS. 10A and 10B are graphical illustrations of varying dopant concentrations in the JFET regions of the gate trench power semiconductor device of FIG. 8.
Figure 10B:
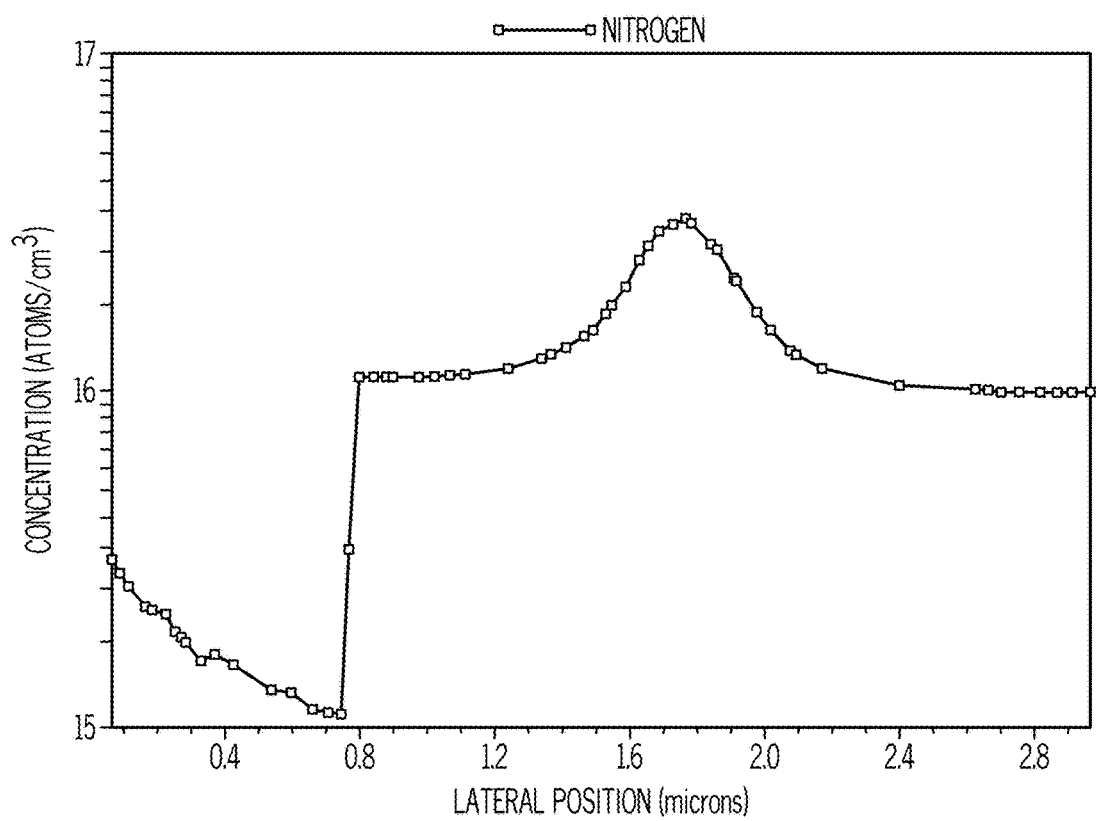

Thus, the dopant concentrations of the JFET region of the drift region 220 may vary in a stepwise or continuous (e.g., linear or exponential) fashion along the x-direction in the drift layer 220, for example, with a substantially uniform or symmetrically varying dopant concentration in the drift region 220 and a gradient or stepwise increase at an interface or boundary between the drift region 220 and the conduction enhancing regions 850, as shown for example in FIG. 10B. The conduction enhancing regions 850 may extend along at least one side and/or a bottom/lower boundary of the shielding patterns 240, and may be laterally spaced apart from and tilted or angled relative to the orientation of the gate trenches 280. The conduction enhancing regions 850 may extend into the drift region 220 through the wells 270 and/or beyond the bottom/lower boundary of the shielding patterns 240. The conduction enhancing regions 850 may otherwise be similar to the conduction enhancing regions 250 of FIG. 2.

FIGS. 9A-9F are schematic cross-sectional views illustrating example operations for fabricating the gate trench power semiconductor device of FIG. 8 with angled conduction enhancing regions 850 according to some embodiments of the present invention. As shown in FIG. 8A, an angled ion implantation process is used to more heavily dope a portion 850 of the drift region 220 of the semiconductor layer structure 206, defining the conduction enhancing regions 850 in portions of the drift region 220 between gate trenches 280 (to be formed in subsequent operations). For example, a first mask 901 (e.g., an oxide mask) may be formed to expose a surface of the drift region 220, and a first ion implantation process may be performed to implant dopants of the same conductivity type as the drift region 220 into the surface exposed by the first mask 901 to define the conduction enhancing regions 850 extending through the P-wells 270 and into the drift region 220. The first ion implantation process may be performed at a non-orthogonal angle relative to the surface of the drift region 220. In some embodiments, the angle of the first ion implantation process may be between about 3° and about 30° relative to a direction normal to the surface of the drift region 220, for example about 5°, about 10°, or about 15°. The energy of the first implantation process may be controlled to provide the lower boundaries of the conduction enhancing regions 850 at a desired depth (relative to the surface of the drift region 220) along the non-orthogonal angle.

In FIG. 9B, a second ion implantation process may be performed to define shielding patterns 240 extending through the P-wells 270 and into the drift region 220. For example, using the same mask 901, the second ion implantation process may be performed to implant dopants of the opposite conductivity type as the drift region 220 into the surface exposed by the mask 901 to define the shielding patterns 240. The conduction enhancing regions 850 extend along one side and under one corner of the shielding patterns 240 in the example of FIGS. 9A-9F, but are angled or tilted relative to the orientations of the shielding patterns 240. That is, the dopant distribution of the conduction enhancing regions 850 is asymmetric or non-uniform along the sides and lower boundaries of the shielding patterns 240. In some embodiments, the order of implantation operations in FIGS. 9A and 9B may be reversed, such that the shielding patterns 240 may be formed before the conduction enhancing regions 850.

As shown in FIG. 9C, the first mask 901 may be removed and a second mask 902 may be formed to cover or protect the shielding patterns 240 and the conduction enhancing regions 850 and expose a surface of the P-well 270 adjacent thereto, and a third ion implantation process is performed to define heavily-doped N+ source regions 260 in upper portions of the P-wells 270. In some embodiments, additional heavily-doped P+ regions (not shown) may be formed in the upper portions of in the P-wells 270 adjacent the N+ source regions 260, for example, via ion implantation using an additional masking operation (not shown). Implant activation and/or other additional processes may be performed to recover or repair damage caused by the implantation process(es).

Referring now to FIG. 9D, further operations may be performed to define gate trenches 280 in the semiconductor layer structure 206 extending through the P-wells 270 and into the drift layer 220, to form a gate insulating layer 282 on the bottom surface and sidewalls of each gate trench 280, and to form a gate electrode 284 on the gate insulating layer 282 to fill the respective gate trenches 280, in a manner similar to the operations discussed above with reference to FIG. 3D. As shown in FIG. 9E, an intermetal dielectric (IMD) layer 286 may be formed on the gate 284, and source contacts 290 (not shown) may be formed on the source regions 260. The source contacts 290 may be ohmic metal in some embodiments. In FIG. 9F, an overlay process may be performed to form layer 903 on the surface of the semiconductor layer structure 206, and a drain contact 292 (not shown) may be formed on the lower surface of the substrate 210.

FIGS. 10A and 10B are graphical illustrations of varying dopant concentrations in the JFET regions of gate trench power semiconductor device of FIG. 8 along the lateral (x-) direction. As shown in FIGS. 10A and 10B, the n-type dopant distribution (illustrated as N dopants) in portions of the drift region between the gate trenches 280 (i.e., in the JFET region) varies as a function of lateral position along the direction of separation of the adjacent gate trenches 280/gates 284. In particular, the N dopant distribution laterally varies in the drift region 220 between the gates 284, with a lowest dopant concentration at a lateral distance of about 0.75 µm (which may correspond to the dopant concentration of the drift region 220), and a peak dopant concentration at a lateral distance of about 1.7 µm (which may correspond to the peak dopant concentration of the conduction enhancing regions 850). As shown in FIG. 10B, the dopant concentration (in this example, n-type) of the conduction enhancing region 850 may be higher than that of the portions of the drift region 220 adjacent the corners of the gate insulating layer 282 by a factor of about 2 or more, e.g., about 5 or more or about 10 or more or about 20 or more, and may thereby shift the peak of the electric field distribution under applied voltage away from the corners of the gate insulating layer 282.

Figure 11A:
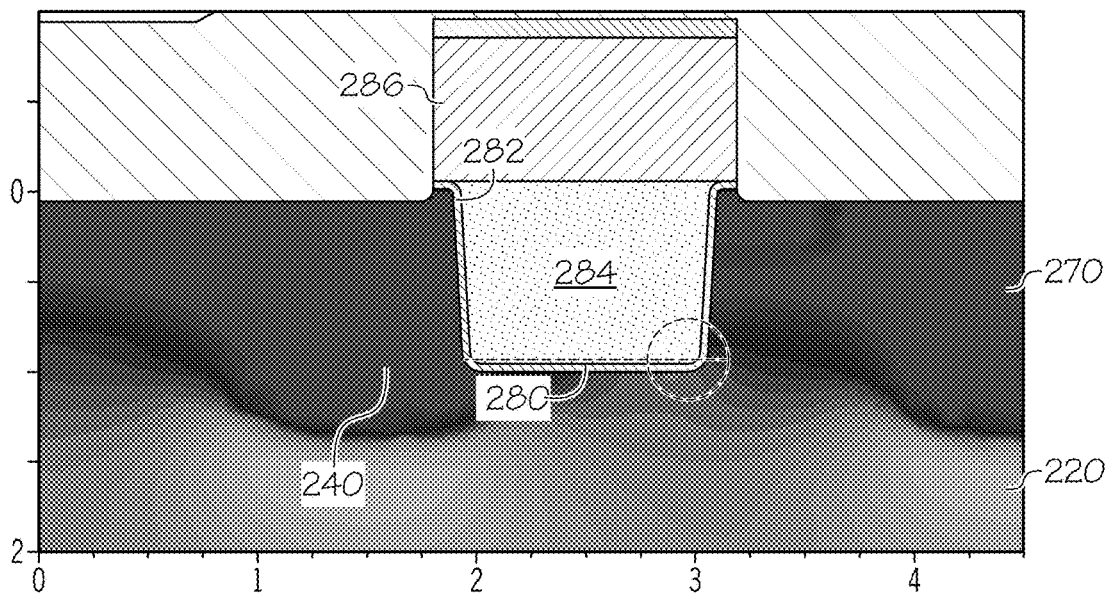
FIGS. 11A and 11B are graphical illustrations of electric field distribution in a gate trench power semiconductor device including drift layers with reduced dopant concentrations in accordance with some embodiments of the present invention.
Figure 11B:
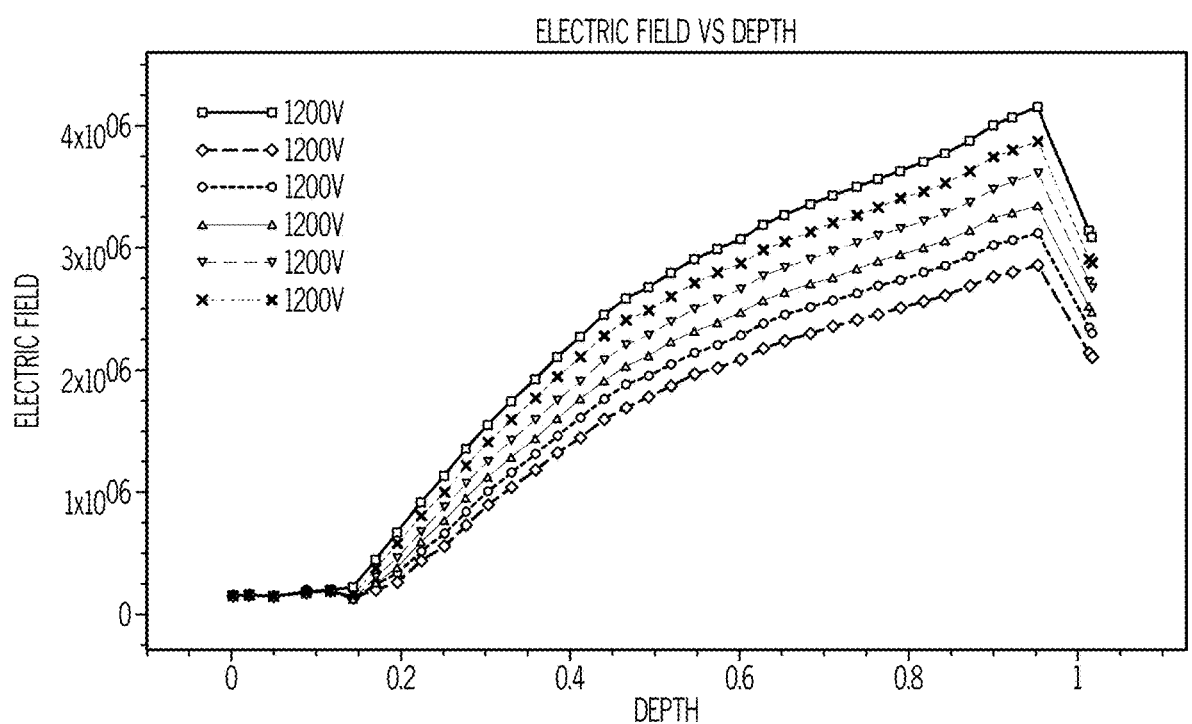

FIGS. 11A and 11B are graphical illustrations of electric field distribution in a gate trench power semiconductor device including drift layers with reduced dopant concentrations in accordance with some embodiments of the present invention. As shown in FIGS. 11A and 11B, the electric field distribution along the bottom of the gate trenches 280 (i.e., in the lateral or x-direction in which the gate trenches 280 are separated from one another) is typically concentrated at the corner of the gate trench 280 that is exposed by the shielding pattern 240. However, FIG. 11B illustrates that the electric field strength is reduced as the dopant concentration of the drift layer or region 220 is reduced, with dopant concentrations of the drift layer 220 being selected or configured to reduce the electric field strength (both at the corners of the gate trench 280 and overall) by a factor of about 10 or more. Reducing the dopant concentration of the drift layer 220 in accordance with embodiments of the present invention may thereby reduce the peak electric field strength at the corners of the gate trench 280, where the gate insulating layer may be more susceptible to breakdown. In combination with conduction enhancing regions as described herein, the peak of the electric field distribution may also be shifted (i.e., in the lateral or x-direction) away from the corners of the gate trenches 282, with an electric field strength comparable to that typically experienced at the corners of the gate trenches 282. In some embodiments, the strength of the electric field distribution in the conduction enhancing regions may be greater than a strength of the electric field distribution at the respective corners of the gate trenches 282 by a factor of about 10 or more. In some embodiments, the strength of the electric field distribution in the conduction enhancing regions may be less than about 5 MV/cm, for example, less than about 3 MV/cm, or less than about 2 MV/cm.

Figure 12:
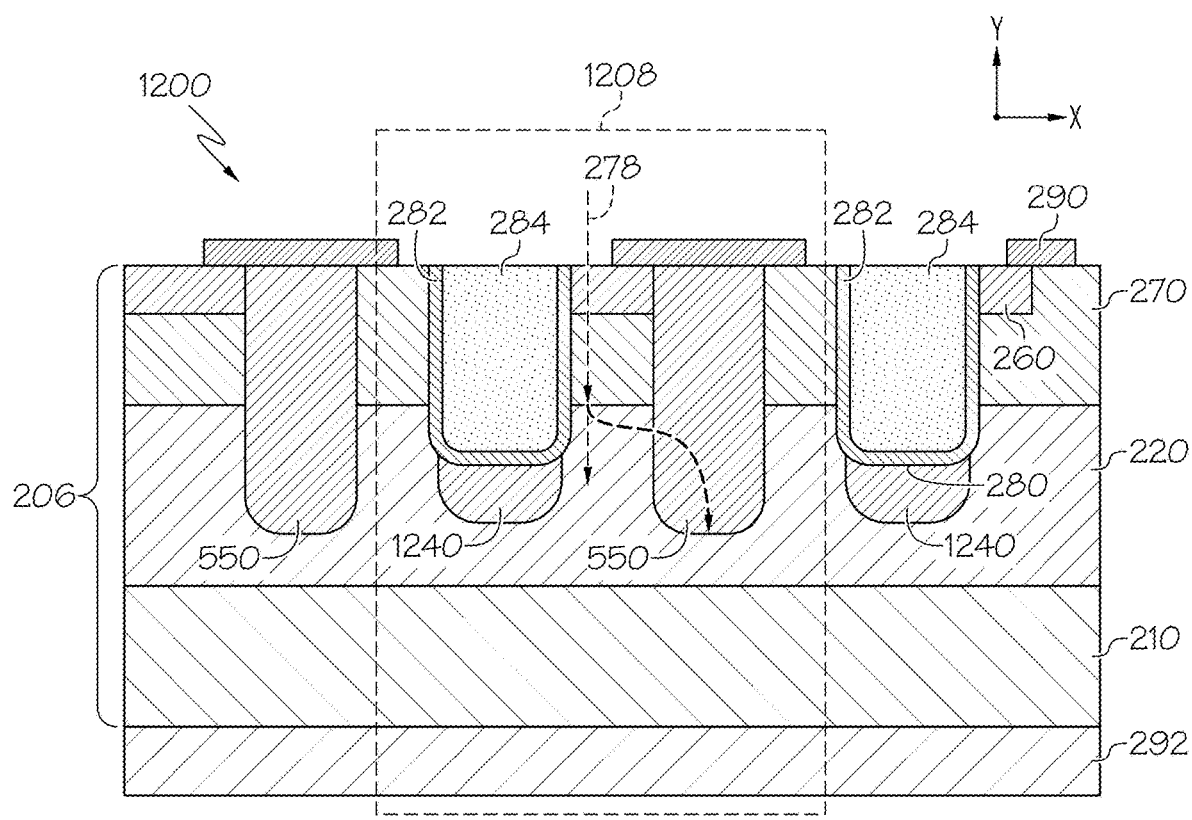
FIG. 12 a schematic cross-sectional view illustrating an example of a gate trench power semiconductor device including bottom shielding regions and offset conduction enhancing regions between gate trenches in accordance with some embodiments of the present invention.

FIG. 12 a schematic cross-sectional view illustrating an example of a gate trench power semiconductor device (shown by way of example as a power MOSFET 1200) including bottom shielding regions 1240 and offset conduction enhancing regions 550 between gate trenches 280 in accordance with some embodiments of the present invention. Some elements of the power MOSFET 1200 may be similar to those of the power MOSFET 500 of FIG. 5, and thus detailed description of such similar elements may be omitted for brevity.

As shown in FIG. 12, the power MOSFET 1200 includes a plurality of unit cells 1208 that are electrically connected in parallel. An example unit cell 1208 is illustrated by the dashed rectangle, but it will be understood that the power MOSFET 1200 may include more unit cells 1208 than the approximately two unit cells shown in FIG. 12.

As in the power MOSFET 500 of FIG. 5, the power MOSFET 1200 includes a heavily-doped ($N^+$) n-type wide bandgap semiconductor substrate 210, a lightly-doped ($N^-$) n-type drift layer or region 220, moderately-doped p-type well regions or P-wells 270, and a heavily-doped $N^+$ source regions 260. A plurality of gate trenches 280 (each including a gate insulating layer 282 on the bottom surface and sidewalls thereof, and gate electrode 284 therein) extend parallel to one another in a longitudinal direction in the semiconductor layer structure 206, and are spaced apart from one another along a direction (e.g., the x-direction) that crosses (e.g., is perpendicular to) the longitudinal direction, with portions of the drift layer or JFET region 220 therebetween. Shielding patterns 240 of the opposite conductivity type as the drift region 220 extend into the semiconductor layer structure 206 along one sidewall and under one corner of each gate trench 280, and may help protect the gate insulating layer 282 at the corner of the gate trench 280 from high electric fields, such as during reverse blocking operation. The absence of the shielding patterns 240 on the other sidewall 278 of the gate trench 280 allows for (here, n-type) channel regions and conduction (shown by dashed arrows in FIG. 12) along one sidewall 278.

As noted above, the drift region 220 is relatively lightly doped to protect or reduce the likelihood of breakdown of the gate insulating layers 282 at the corners of the gate trenches 280. To compensate for the reduced dopant concentration (and thus increased resistance) of the drift region 220, conduction enhancing regions 550 of the same conductivity type as but with a higher dopant concentration than the drift region 220 are formed in portions of the drift region 220 between gate trenches 280 (i.e., in the JFET region). In the example device 1200 of FIG. 12, n-type conduction enhancing regions 550 are formed in the portions of drift region 220 between the gate trenches 280, e.g., by ion implantation, but are offset from the p-type shielding patterns 1240. The conduction enhancing regions 550 may extend into the drift region 220 through the wells 270 and/or beyond the bottom/lower boundary of the shielding patterns 1240. The more highly-doped n-type portion 550 of the JFET region provides a lower resistance current path (shown by the bolded and dashed arrow in FIG. 8). As such, the (in this example, n-type) dopant concentration of portions of the drift region 220 between gate trenches 280 may vary (e.g., with a non-uniform dopant distribution or concentration gradient) along the direction in which the gate trenches 280 are spaced apart from one another (e.g., in the x-direction in FIG. 12), which may shift the peak electric field distribution away from the corners of the gate trenches 280 under applied voltage.

In the device 1200 of FIG. 12, the shielding patterns 1240 of the power MOSFET 1200 are formed under the bottom surface of the gate trenches 280, while the opposing sidewalls of the gate trenches 280 are free of the shielding patterns 1240. The shielding patterns 1240 may otherwise be similar to the shielding patterns 240 described herein. More generally, power semiconductor devices as described herein may include the shielding patterns 240, 1240 between and/or under the gate trenches 280 (e.g., along at least one sidewall and/or along the bottom surface of the gate trenches), in various portions of the drift layer 220 between the adjacent gate trenches 280.

FIGS. 13A-13F are schematic cross-sectional views illustrating example operations for fabricating gate trench power semiconductor devices including bottom shielding regions 1240 with aligned conduction enhancing regions 250 according to some embodiments of the present invention. As shown in FIG. 13A, an ion implantation process is used to more heavily dope a portion 250 of the drift region 220 of the semiconductor layer structure 206, defining the conduction enhancing regions 250 in portions of the drift region 220 between gate trenches 280 (to be formed in subsequent operations). For example, a first mask 1301 (e.g., an oxide mask) may be formed to expose a surface of the drift region 220 or P-well 270, and a first ion implantation process may be performed to implant dopants of the same conductivity type as the drift region 220 into the surface exposed by the first mask 1301 to define the conduction enhancing regions 250 extending through the P-wells 270 and into the drift region 220. The energy of the first implantation process may be controlled to provide the lower boundaries of the conduction enhancing regions 250 at a desired depth (relative to the surface of the drift region 220).

In FIG. 13B, a second ion implantation process may be performed to define shielding patterns 1240 extending through the P-wells 270 and into the drift region 220. For example, using the same mask 1301, the second ion implantation process may be performed to implant dopants of the opposite conductivity type as the drift region 220 into the surface exposed by the mask 1301 to define the shielding patterns 1240. The shielding patterns 1240 are thus aligned with the conduction enhancing regions 250, which extend along opposing sides and under opposing corners of the shielding patterns 1240 in the example of FIGS. 13A-13F. In some embodiments, the order of implantation operations in FIGS. 13A and 13B may be reversed, such that the shielding patterns 1240 may be formed before the conduction enhancing regions 250.

As shown in FIG. 13C, the first mask 1301 may be removed and a second mask 1302 may be formed to cover or protect the shielding patterns 1240 and the conduction enhancing regions 250 and expose a surface of the P-wells 270 adjacent thereto. A third ion implantation process is performed to define heavily-doped $N^+$ source regions 260 in upper portions of the P-wells 270. In some embodiments, additional heavily-doped P+ regions (not shown) may be formed in the upper portions of in the P-wells 270 adjacent the $N^+$ source regions 260, for example, via ion implantation using an additional masking operation (not shown). An implant activation and/or other additional processes may be performed to recover or repair damage caused by the implantation process(es).

Referring now to FIG. 13D, further operations may be performed to define gate trenches 280 in the semiconductor layer structure 206 extending through the P-wells 270 and into the drift layer 220, to form a gate insulating layer 282 on the bottom surface and sidewalls of each gate trench 280, and to form a gate electrode 284 on the gate insulating layer 282 to fill the respective gate trenches 280. The gate trench 280 may be fabricated in a manner similar to the operations discussed above with reference to FIG. 3D, but using a gate mask (not shown) that exposes the shielding patterns 1240. The gate mask may expose at least a portion of the conduction enhancing region 250 in some embodiments. An etching process may be controlled such that a depth or bottom surface of the trenches 280 are confined above and do not extend beyond the shielding patterns 1240 and/or conduction enhancing regions 250. The conduction enhancing regions 250 may thus extend along sidewalls of the gate trenches 280 (and along side- and lower-boundaries of the shielding patterns 1240), while the shielding patterns 1240 extend along the bottom surface and corners of the gate trenches 280. That is, the conduction enhancing regions 250 may increase conduction to compensate for the reduced dopant concentration of the drift region 220, while the shielding patterns 1240 may protect the gate insulating layer 282 at corners of the gate trenches 280 from breakdown.

As shown in FIG. 13E, an intermetal dielectric (IMD) layer 286 may be formed on the gate 284, and source contacts (not shown) may be formed on the source regions 260. The source contacts may be ohmic metal in some embodiments. In FIG. 13F, an overlay process may be performed to form layer 1303 on the surface of the semiconductor layer structure 206, and a drain contact (not shown) may be formed on the lower surface of the substrate 210.

Figure 14:
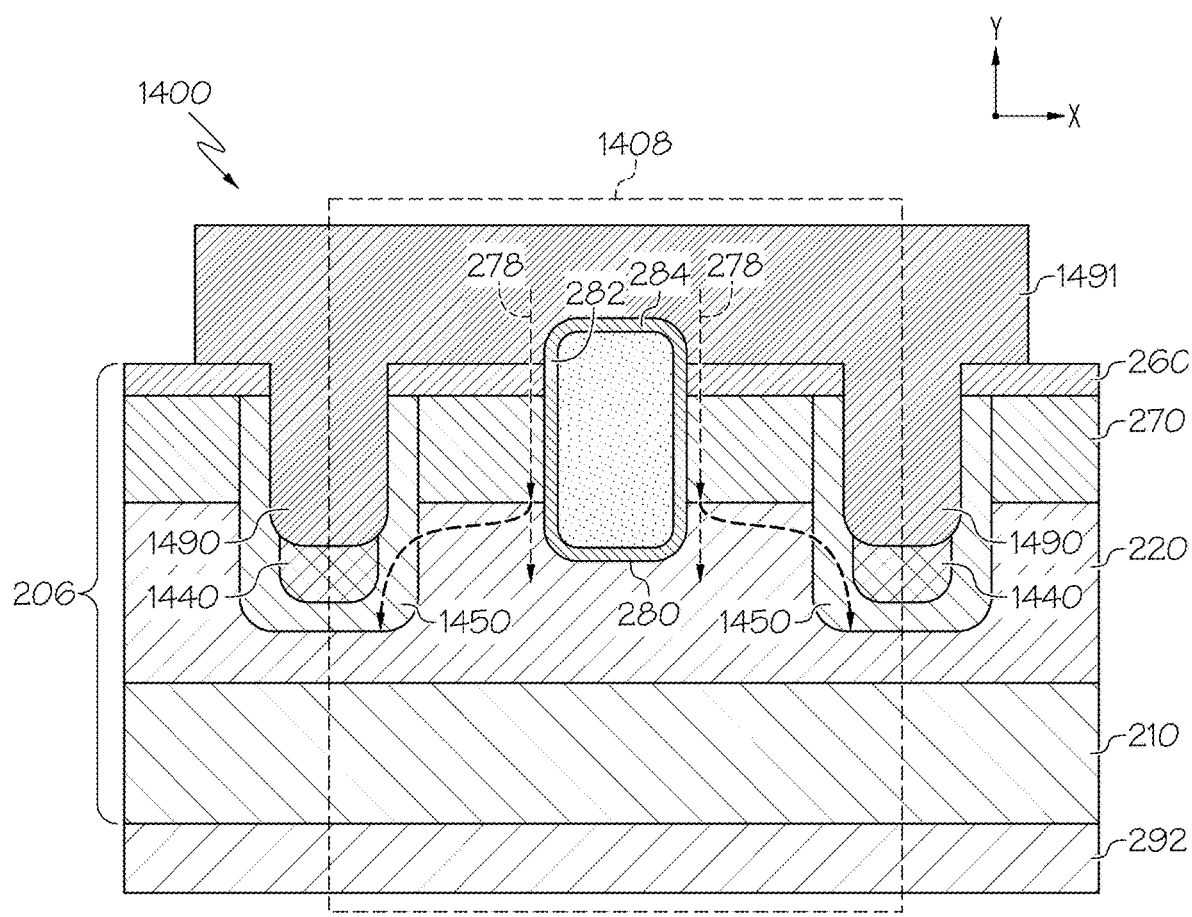
FIG. 14 is a schematic cross-sectional view illustrating an example of a gate trench power semiconductor device including alternating shielding regions and aligned conduction enhancing regions between gate trenches in accordance with some embodiments of the present invention.

FIG. 14 is a schematic cross-sectional view illustrating an example of a gate trench power semiconductor device (shown by way of example as a power MOSFET 1400) including alternating shielding regions 1440 and aligned conduction enhancing regions 1450 between gate trenches 280 in accordance with some embodiments of the present invention. Some elements of the power MOSFET 1400 may be similar to those of the power MOSFET 200 of FIG. 2, and thus detailed description of such similar elements may be omitted for brevity. The power MOSFET 1400 includes a plurality of unit cells 1408 that are electrically connected in parallel. An example unit cell 1408 is illustrated by the dashed rectangle, but it will be understood that the power MOSFET 1400 may include more unit cells 1408 than shown in FIG. 14.

As in the power MOSFET 200 of FIG. 2, the power MOSFET 1400 includes a heavily-doped ($N^+$) n-type wide bandgap semiconductor substrate 210, a lightly-doped ($N^-$) n-type drift layer or region 220, moderately-doped p-type well regions or P-wells 270, and a heavily-doped $N^+$ source regions 260. A plurality of gate trenches 280 (each including a gate insulating layer 282 on the bottom surface and sidewalls thereof, and gate electrode 284 therein) extend parallel to one another in a longitudinal direction in the semiconductor layer structure 206, and are spaced apart from one another along a direction (e.g., the x-direction) that crosses (e.g., is perpendicular to) the longitudinal direction, with portions of the drift layer or JFET region 220 therebetween. Shielding patterns 1440 of the opposite conductivity type as the drift region 220 extend into the semiconductor layer structure 206 in portions of the drift region 220 between adjacent gate trenches 280. In the device 1400 of FIG. 14, the opposing sidewalls of the gate trenches 280 are free of the shielding patterns 1440, which allows for (here, n-type) channel regions and conduction (shown by dashed arrows in FIG. 14) along both sidewalls 278 of the gate trenches 280. The shielding patterns 1440 are configured to provide the voltage and/or current blocking by connections to respective source contacts 1490, which are connected by a shielding connection pattern 1491 at the top of the device 1400 to allow the deep shielding patterns 1440 to be electrically grounded.

As noted above, the drift region 220 is relatively lightly doped to protect or reduce the likelihood of breakdown of the gate insulating layers 282 at the corners of the gate trenches 280. To compensate for the reduced dopant concentration (and thus increased resistance) of the drift region 220, conduction enhancing regions 1450 of the same conductivity type as but with a higher dopant concentration than the drift region 220 are formed in portions of the drift region 220 between gate trenches 280 (i.e., in the JFET region). In the example device 1400 of FIG. 14, n-type conduction enhancing regions 1450 are formed in the portions of drift region 220 between the gate trenches 280, e.g., by ion implantation, and are aligned with the p-type shielding patterns 1440. For example, as shown in the operations of FIGS. 3A and 3B, respective ion implantation processes using same implantation mask may be used to form the shielding patterns 1440 aligned with the conduction enhancing regions 1450. The more highly-doped n-type portions 1450 of the JFET region provide a lower resistance current path (shown by the bolded and dashed arrow in FIG. 14).

As such, the (in this example, n-type) dopant concentration of portions of the drift region 220 between gate trenches 280 may vary (e.g., with a non-uniform dopant distribution or concentration gradient) along the direction in which the gate trenches 280 are spaced apart from one another (e.g., in the x-direction in FIG. 14), which may shift the peak electric field distribution away from the corners of the gate trenches 280 under applied voltage. The conduction enhancing regions 1450 may extend along at least one side and/or a bottom/lower boundary of the shielding patterns 1440. The conduction enhancing regions 1450 may extend into the drift region 220 through the wells 270 and/or beyond the bottom/lower boundary of the shielding patterns 1440.

Figure 15:
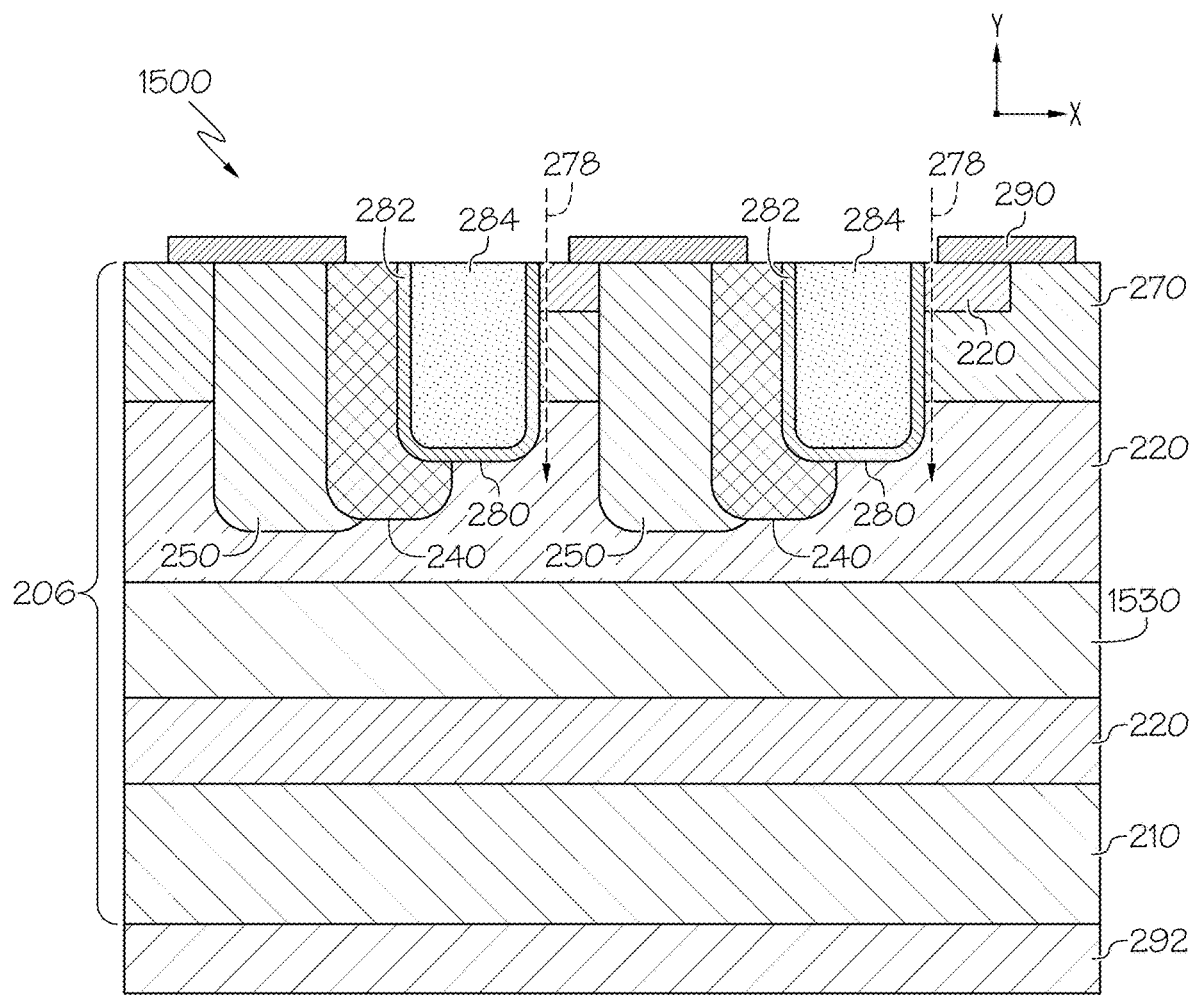
FIG. 15 is a schematic cross-sectional view illustrating an example of a gate trench power semiconductor device including shielding regions and offset conduction enhancing regions between gate trenches with a higher-doped current spreading layer or region in accordance with some embodiments of the present invention.

FIG. 15 is a schematic cross-sectional view illustrating an example of a gate trench power semiconductor device (shown by way of example as a power MOSFET 1500) including a higher-doped (relative to the drift region 220) current spreading layer 1530 in accordance with embodiments of the present disclosure. As shown in FIG. 15, the device 1500 is similar to the device 500 of FIG. 5 but the drift region 220 further includes a heavily-doped current spreading layer 1530 (e.g., an ($N^+$) n-type current spreading layer) between the upper portion of the drift region 220 and the substrate 210. The current spreading layer 1530 and the conduction enhancing regions 550 may each have a higher concentration of dopants than the drift region 220, for example, a dopant concentration of between about $1 \times 10^{15}$ atoms/cm$^3$ and $1 \times 10^{17}$ atoms/cm$^3$ or more, for example, about $2 \times 10^{16}$ atoms/cm$^3$ to $8 \times 10^{16}$ atoms/cm$^3$ or about $5 \times 10^{15}$ to $5 \times 10^{16}$ atoms/cm$^3$. In some embodiments, the current spreading layer 1530 may have a higher concentration of (in this example, n-type) dopants than the conduction enhancing regions 550. For example, the conduction enhancing regions 550 may have a higher concentration of dopants than the drift region 220 by a factor of about 2 or more, e.g., about 5 or more or about 10 or more or about 20 or more, and the current spreading layer 1530 may have a higher concentration of dopants than the conduction enhancing regions 550. The elements and layers of device 1500, including the shielding regions 240 and offset conduction enhancing regions 550, may otherwise be identical to the device 200 of FIG. 5, and thus further description thereof is omitted for brevity. It will also be appreciated that current spreading layer 1530 shown in FIG. 15 may be similarly incorporated between the upper portion of the drift region 220 and the substrate 210 in any of the devices (e.g., 200, 500, 800, 1200, 1400) or various embodiments described herein.

More generally, it will be appreciated that features of the different embodiments disclosed herein may be combined in any way to provide many additional embodiments. Also, while the present invention is described above primarily with respect to power MOSFET implementations, it will be appreciated that the techniques described herein apply equally well to other similar power semiconductor devices requiring high voltage blocking and/or otherwise including areas or regions susceptible to breakdown in reverse blocking. Thus, embodiments of the present invention are not limited MOSFETs, and the techniques disclosed herein may be used on IGBTs or any other appropriate gate trench device. For example, features of any MOSFET embodiment described herein may be incorporated into IGBT embodiments fabricated on SiC, or other semiconductor materials, for example, Si. Thus, it will be appreciated that various features of the inventive concepts are described herein with respect to specific examples, but that these features may be added to other embodiments and/or used in place of example features of other embodiments to provide many additional embodiments. The present invention should therefore be understood to encompass these different combinations.

Accordingly, some embodiments of the present invention may include drift layers or regions with a reduced dopant concentration to protect the oxide layer at corners of the trenches, thereby reducing the likelihood of gate oxide breakdown and improving reliability. Additionally or alternatively, some embodiments of the present invention may include a conduction enhancing region with increased dopant concentration in portions of the drift layer between gate trenches, thereby improving conduction, e.g., to offset increases in resistance of the reduced dopant concentration drift layer.

In the description above, each example embodiment is described with reference to regions of particular conductivity types. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOSFET, IGBT, etc.).

The present invention has primarily been discussed above with respect to silicon carbide based power semiconductor devices. It will be appreciated, however, that silicon carbide is used herein as an example and that the devices discussed herein may be formed in any appropriate wide bandgap semiconductor material system. As an example, gallium nitride based semiconductor materials (e.g., gallium nitride, aluminum gallium nitride, etc.) may be used instead of silicon carbide in any of the embodiments described above. More generally, while discussed with reference to silicon carbide devices, embodiments of the present invention are not so limited, and may have applicability to devices formed using other wide bandgap semiconductor materials, for example, gallium nitride, zinc selenide, or any other II-VI or III-V wide bandgap compound semiconductor materials.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a fabrication operations. It will be appreciated that the steps shown in the fabrication operations need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A power semiconductor device, comprising:
a semiconductor layer structure comprising a drift region of a first conductivity type and a well region of a second conductivity type;
a plurality of gate trenches extending into the drift region;
respective shielding patterns of the second conductivity type in respective first portions of the drift region adjacent the gate trenches; and
respective conduction enhancing regions of the first conductivity type in respective second portions of the drift region, wherein the respective conduction enhancing regions extend into the well region adjacent the respective shielding patterns,
wherein the drift region comprises a first concentration of dopants of the first conductivity type, and wherein the respective conduction enhancing regions comprise a second concentration of the dopants of the first conductivity type that is higher than the first concentration,
wherein the gate trenches are spaced apart from one another along a first direction, and the respective conduction enhancing regions are spaced apart from corners of the gate trenches along the first direction by the respective shielding patterns or by the drift region.

2. The power semiconductor device of claim 1, wherein respective portions of the drift region between the gate trenches comprise a concentration gradient of the dopants of the first conductivity type that varies between the first concentration and the second concentration along the first direction.

3. The power semiconductor device of claim 1, wherein the drift region comprises the first concentration of the dopants proximate the corners of the gate trenches, and wherein the second concentration is higher than the first concentration by a factor of about 2 or more.

4. The power semiconductor device of claim 1, wherein, responsive to a voltage applied to the power semiconductor device, respective portions of the drift region between the gate trenches comprise an electric field distribution having a peak that is distal from the corners of the gate trenches in the first direction.

5. The power semiconductor device of claim 4, wherein the peak of the electric field distribution is greater than a strength of the electric field distribution proximate the corners of the gate trenches by a factor of about 10 or more.

6. The power semiconductor device of claim 1, wherein the semiconductor layer structure further comprises:
a current spreading layer comprising a third concentration of the dopants of the first conductivity type that is higher than the first and/or second concentrations,
wherein the respective second portions of the drift region comprising the respective conduction enhancing regions are between the well region and the current spreading layer.

7. The power semiconductor device of claim 1, wherein the semiconductor layer structure comprises a wide bandgap semiconductor, wherein the drift region comprises an epitaxial layer of the first conductivity type, and wherein the respective conduction enhancing regions comprise implanted regions of the first conductivity type.

8. The power semiconductor device of claim 1, wherein the respective conduction enhancing regions are in direct contact with the respective shielding patterns.

9. The power semiconductor device of claim 1, wherein the respective conduction enhancing regions extend around a periphery of the respective shielding patterns.

10. A power semiconductor device, comprising:
a semiconductor layer structure comprising a drift region of a first conductivity type and a well region of a second conductivity type;
a plurality of gate trenches extending into the drift region;
respective shielding patterns of the second conductivity type in respective first portions of the drift region adjacent the gate trenches; and
respective conduction enhancing regions of the first conductivity type in respective second portions of the drift region, wherein the respective conduction enhancing regions extend into the well region adjacent the respective shielding patterns,
wherein the drift region comprises a first concentration of dopants of the first conductivity type, the respective conduction enhancing regions comprise a second concentration of the dopants of the first conductivity type that is higher than the first concentration, and the respective conduction enhancing regions are between the gate trenches and extend into the drift region beyond a lower boundary of the respective shielding patterns.

11. The power semiconductor device of claim 10, wherein the respective conduction enhancing regions are offset from the respective shielding patterns towards the gate trenches.

12. The power semiconductor device of claim 10, wherein the respective conduction enhancing regions extend along opposing sides and the lower boundary of the respective shielding patterns.

13. The power semiconductor device of claim 10, wherein the respective conduction enhancing regions extend along an axis that is non-orthogonal to a surface of the drift region.

14. A method of fabricating a power semiconductor device, the method comprising:
forming a semiconductor layer structure comprising a drift region of a first conductivity type and a well region of a second conductivity type;
forming respective conduction enhancing regions of the first conductivity type in respective first portions of the drift region;
forming respective shielding patterns of the second conductivity type in respective second portions of the drift region; and
forming a plurality of gate trenches extending into the drift region,
wherein the respective conduction enhancing regions extend into the well region adjacent the respective shielding patterns, wherein the drift region comprises a first concentration of dopants of the first conductivity type, and wherein the respective conduction enhancing regions comprise a second concentration of the dopants of the first conductivity type that is higher than the first concentration,
wherein the gate trenches are spaced apart from one another along a first direction, and the respective conduction enhancing regions are spaced apart from corners of the gate trenches along the first direction by the respective shielding patterns or by the drift region.

15. The method of claim 14, wherein the respective portions of the drift region between the gate trenches comprise a concentration gradient of the dopants of the first conductivity type that varies between the first concentration and the second concentration along the first direction.

16. The method of claim 15, wherein the semiconductor layer structure comprises a wide bandgap semiconductor, wherein the drift region comprises an epitaxial layer of the first conductivity type, and wherein the respective conduction enhancing regions comprise implanted regions of the first conductivity type.

17. The method of claim 16, wherein the drift region comprises the first concentration of the dopants proximate the corners of the gate trenches, and wherein the second concentration is higher than the first concentration by a factor of about 10 or more.

18. The method of claim 14, wherein the respective conduction enhancing regions are between the gate trenches and extend into the drift region beyond a lower boundary of the respective shielding patterns.

19. The method of claim 18, wherein the respective conduction enhancing regions are offset from the respective shielding patterns towards the gate trenches.

20. The method of claim 18, wherein the respective conduction enhancing regions extend along at least one of a side or a lower boundary of the respective shielding patterns.

21. The method of claim 14, wherein the respective conduction enhancing regions extend around a periphery of the respective shielding patterns.

* * * * *